(12) United States Patent
Kremin et al.

(10) Patent No.: US 8,860,682 B1
(45) Date of Patent: Oct. 14, 2014

(54) HARDWARE DE-CONVOLUTION BLOCK FOR MULTI-PHASE SCANNING

(71) Applicant: Cypress Semiconductor Corporation, San Jose, CA (US)

(72) Inventors: Viktor Kremin, Lviv (UA); Volodymyr Bihday, Lviv (UA); Jan-Willem Waerdt, San Jose, CA (US); Colm O'Keeffe, Co. Cork (IE); Aaron Hogan, Co. Cork (IE); Paul Kelleher, Co. Cork (IE)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 14/024,299

(22) Filed: Sep. 11, 2013

Related U.S. Application Data

(60) Provisional application No. 61/814,508, filed on Apr. 22, 2013.

(51) Int. Cl.
*G06F 3/041* (2006.01)
*G06F 3/045* (2006.01)
*G01R 27/26* (2006.01)

(52) U.S. Cl.
CPC .................................. *G01R 27/2605* (2013.01)
USPC ............................ 345/173; 345/174; 324/678

(58) Field of Classification Search
USPC .......................................................... 345/173
See application file for complete search history.

(56) References Cited

U.S. PATENT DOCUMENTS

| | | | |
|---|---|---|---|
| 7,834,862 B2 | 11/2010 | Liao et al. | |
| 7,952,564 B2 | 5/2011 | Hurst et al. | |
| 7,973,771 B2 | 7/2011 | Geaghan | |
| 7,995,036 B2 | 8/2011 | Perski et al. | |
| 8,031,094 B2 | 10/2011 | Hotelling et al. | |
| 8,054,090 B2 | 11/2011 | Philipp et al. | |
| 8,228,076 B2 * | 7/2012 | Cormier et al. | 324/678 |
| 8,432,170 B1 | 4/2013 | Walsh et al. | |
| 2007/0075923 A1 | 4/2007 | Beuker et al. | |
| 2008/0007534 A1 | 1/2008 | Peng et al. | |
| 2008/0079699 A1 | 4/2008 | Mackey | |
| 2008/0150906 A1 | 6/2008 | Grivna | |
| 2008/0246723 A1 | 10/2008 | Baumbach | |

(Continued)

FOREIGN PATENT DOCUMENTS

| | | |
|---|---|---|
| KR | 20060132145 A | 12/2006 |
| WO | WO2013019743 A2 | 2/2013 |

OTHER PUBLICATIONS

"Touch Sensor Controllers (TSC): Fujitsu Europe, Middle East and Africa" www.fujitsu.com/emea/services/microelectronics/tsc/ Aug. 2, 2013, 1 page.

(Continued)

*Primary Examiner* — Charles V Hicks
(74) *Attorney, Agent, or Firm* — Lowenstein Sandler LLP

(57) ABSTRACT

Apparatuses and methods of hardware de-convolution for multi-phase scanning of a touch arrays are described. One apparatus includes a memory device configured to store a capacitance map including convolved capacitance data. The convolved data are results of multi-phase transmit (TX) scanning of a sense array with multiple TX patterns. The apparatus further comprises a de-convolution circuit block coupled to the memory device. The de-convolution circuit block is configured to de-convolve the convolved capacitance data with inverses of the multiple TX patterns to obtain capacitance data for a de-convolved capacitance map.

20 Claims, 12 Drawing Sheets

(56) References Cited

U.S. PATENT DOCUMENTS

| | | | |
|---|---|---|---|
| 2009/0009483 | A1 | 1/2009 | Hotelling et al. |
| 2009/0128666 | A1 | 5/2009 | Rappaport et al. |
| 2009/0153152 | A1 | 6/2009 | Maharyta et al. |
| 2009/0262087 | A1 | 10/2009 | Kim |
| 2010/0033196 | A1 | 2/2010 | Hayakawa et al. |
| 2010/0060591 | A1 | 3/2010 | Yousefpor et al. |
| 2010/0073341 | A1 | 3/2010 | Toyooka et al. |
| 2010/0139991 | A1 | 6/2010 | Philipp et al. |
| 2010/0141605 | A1 | 6/2010 | Kang et al. |
| 2010/0149127 | A1 | 6/2010 | Fisher et al. |
| 2010/0193258 | A1 | 8/2010 | Simmons et al. |
| 2010/0244859 | A1 | 9/2010 | Cormier, Jr. et al. |
| 2010/0295564 | A1 | 11/2010 | Reynolds |
| 2011/0037724 | A1 | 2/2011 | Paulsen et al. |
| 2011/0055305 | A1 | 3/2011 | Matsushima |
| 2011/0063154 | A1 | 3/2011 | Hotelling et al. |
| 2011/0063229 | A1* | 3/2011 | Krah et al. ............... 345/173 |
| 2011/0109568 | A1 | 5/2011 | Wu et al. |
| 2011/0163992 | A1 | 7/2011 | Cordeiro et al. |
| 2011/0254802 | A1 | 10/2011 | Philipp |
| 2012/0013564 | A1* | 1/2012 | Westhues et al. ............ 345/174 |
| 2012/0013565 | A1 | 1/2012 | Westhues et al. |
| 2012/0056841 | A1 | 3/2012 | Krenik et al. |
| 2012/0110662 | A1 | 5/2012 | Brosnan |
| 2012/0268142 | A1 | 10/2012 | Kremin et al. |
| 2013/0027346 | A1 | 1/2013 | Yarosh et al. |
| 2013/0057506 | A1 | 3/2013 | Hu et al. |

OTHER PUBLICATIONS

Search Report for "Hardware De-convolution Block for TX multiphase scanning on a TouchScreen Controller" Aug. 2013, 18 pages.

U.S. Appl. No. 13/247,779: "Capacitive Panel Scanning With Reduced Number of Sensing Circuits" Viktor Kremin et al., filed on Sep. 28, 2011; 68 pages.

U.S. Appl. No. 13/629,437: "Usage of Weighting Matrices in Multi-Phase Scanning Modes" Andriy Maharyta et al., filed on Sep. 27, 2012; 77 pages.

Fang, W. (Jul. 2007). "Reducing Analog Input Noise in Touch Screen Systems" Texas Instruments Application Report, 12 pages.

International Search Report for International Application No. PCT/IB2011/003284 dated Dec. 30, 2011; 4 pages.

International Search Report for International Application No. PCT/US12/72201 dated Mar. 11, 2013; 2 pages.

International Search Report for International Application No. PCT/US13/60385 dated Feb. 25, 2014; 2 pages.

Silicon Labs. "How to minimize touchscreen Electromagnetic Interference." 7 pages.

USPTO Advisory Action for U.S. Appl. No. 13/629,437 dated Sep. 18, 2013; 3 pages.

USPTO Final Rejection for U.S. Appl. No. 13/629,437 dated Apr. 10, 2013; 17 pages.

USPTO Non Final Rejection for U.S. Appl. No. 13/247,779 dated Oct. 25, 2013; 15 pages.

USPTO Non-Final Rejection for U.S. Appl. No. 13/629,437 dated Dec. 10, 2012; 15 pages.

USPTO Notice of Allowance for U.S. Appl. No. 13/629,437 dated Feb. 3, 2014; 12 pages.

USPTO Notice of Allowance for U.S. Appl. No. 13/629,437 dated Mar. 17, 2014; 12 pages.

USPTO Notice of Allowance for U.S. Appl. No. 13/629,437 dated Oct. 29, 2013; 14 pages.

USPTO Notice of Allowance for U.S. Appl. No. 13/629,437 dated Dec. 27, 2013; 13 pages.

Written Opinion of the International Searching Authority for International Application No. PCT/IB2011/003284 mailed Oct. 19, 2013; 7 pages.

Written Opinion of the International Searching Authority for International Application No. PCT/US12/72201 mailed Mar. 11, 2013; 9 pages.

Written Opinion of the International Searching Authority for International Application No. PCT/US13/60385 mailed May 25, 2014; 6 pages.

* cited by examiner

| TX lines 702 | TX patterns 704 | | | | | | | |
|---|---|---|---|---|---|---|---|---|
| | TX Patt0 | TX Patt1 | TX Patt2 | TX Patt3 | TX Patt4 | TX Patt5 | TX Patt6 | TX Patt7 |
| TX Line 0 | 1 | 1 | 1 | -1 | 0 | 0 | 0 | 0 |
| TX Line 1 | -1 | 1 | 1 | 1 | 0 | 0 | 0 | 0 |
| TX Line 2 | 1 | -1 | 1 | 1 | 0 | 0 | 0 | 0 |
| TX Line 3 | 1 | 1 | -1 | 1 | 0 | 0 | 0 | 0 |
| TX Line 4 | 0 | 0 | 0 | 0 | 1 | 1 | 1 | -1 |
| TX Line5 | 0 | 0 | 0 | 0 | -1 | 1 | 1 | 1 |
| TX Line 6 | 0 | 0 | 0 | 0 | 1 | -1 | 1 | 1 |
| TX Line 7 | 0 | 0 | 0 | 0 | 1 | 1 | -1 | 1 |

Multiphase Group 0 706

Multiphase Group 1 708

FIG. 7

HARDWARE DE-CONVOLUTION BLOCK FOR MULTI-PHASE SCANNING

RELATED APPLICATIONS

This application claims the benefit of U.S. Provisional Application No. 61/814,508, filed Apr. 22, 2013, the entire contents of which are incorporated by reference herein.

TECHNICAL FIELD

The present disclosure relates generally to sensing systems, and more particularly to capacitance-sensing systems configurable to determine touch locations of touches on the capacitive-sensing systems.

BACKGROUND

Capacitance sensing systems can sense electrical signals generated on electrodes that reflect changes in capacitance. Such changes in capacitance can indicate a touch event (i.e., the proximity of an object to particular electrodes). Capacitive sense elements may be used to replace mechanical buttons, knobs and other similar mechanical user interface controls. The use of a capacitive sense element allows for the elimination of complicated mechanical switches and buttons, providing reliable operation under harsh conditions. In addition, capacitive sense elements are widely used in modern customer applications, providing new user interface options in existing products. Capacitive sense elements can range from a single button to a large number arranged in the form of a capacitive sense array for a touch-sensing surface.

Transparent touch screens that utilize capacitive sense arrays are ubiquitous in today's industrial and consumer markets. They can be found on cellular phones, GPS devices, set-top boxes, cameras, computer screens, MP3 players, digital tablets, and the like. The capacitive sense arrays work by measuring the capacitance of a capacitive sense element, and looking for a delta in capacitance indicating a touch or presence of a conductive object. When a conductive object (e.g., a finger, hand, or other object) comes into contact or close proximity with a capacitive sense element, the capacitance changes and the conductive object is detected. The capacitance changes of the capacitive touch sense elements can be measured by an electrical circuit. The electrical circuit converts the measured capacitances of the capacitive sense elements into digital values.

There are two typical types of capacitance: 1) mutual capacitance where the capacitance-sensing circuit has access to both electrodes of the capacitor; 2) self-capacitance where the capacitance-sensing circuit has only access to one electrode of the capacitor where the second electrode is tied to a DC voltage level or is parasitically coupled to Earth Ground. A touch panel has a distributed load of capacitance of both types (1) and (2) and Cypress' touch solutions sense both capacitances either uniquely or in hybrid form with its various sense modes.

BRIEF DESCRIPTION OF THE DRAWINGS

The present invention is illustrated by way of example, and not of limitation, in the figures of the accompanying drawings.

FIG. 7 illustrates a table of two multi-phase groups with multiple TX patterns according to one embodiment.

DETAILED DESCRIPTION

Figure 1:
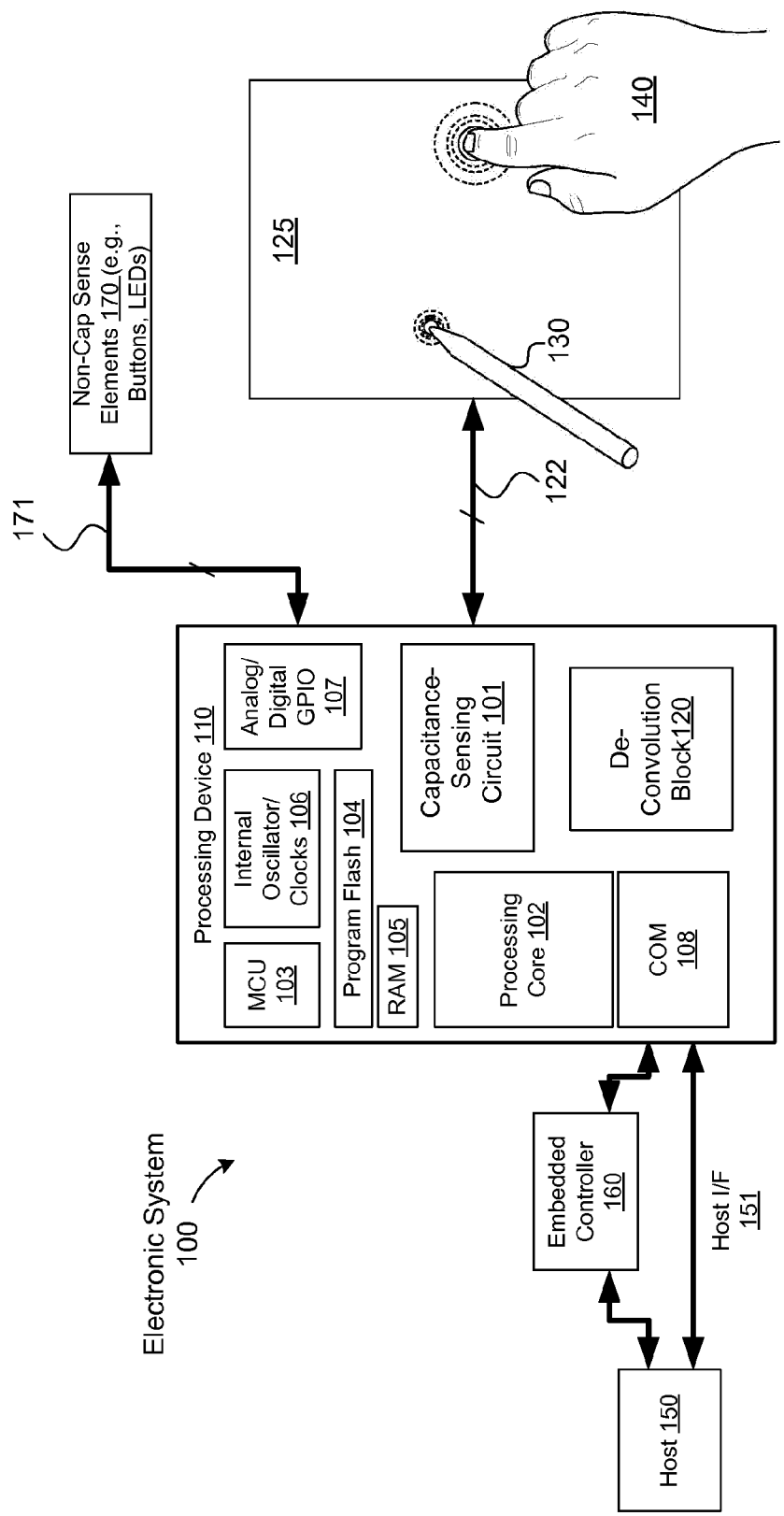
FIG. 1 is a block diagram illustrating one embodiment of an electronic system having a processing device including a de-convolution circuit block.

In the following description, for purposes of explanation, numerous specific details are set forth in order to provide a thorough understanding of the present invention. It will be evident, however, to one skilled in the art that the present invention may be practiced without these specific details. In other instances, well-known circuits, structures, and techniques are not shown in detail, but rather in a block diagram in order to avoid unnecessarily obscuring an understanding of this description.

Reference in the description to "one embodiment" or "an embodiment" means that a particular feature, structure, or characteristic described in connection with the embodiment is included in at least one embodiment of the invention. The phrase "in one embodiment" located in various places in this description does not necessarily refer to the same embodiment.

Apparatuses and methods of hardware de-convolution for multi-phase scanning of a touch arrays are described. One apparatus includes a memory device configured to store a capacitance map including convolved capacitance data. The convolved data are results of multi-phase transmit (TX) scanning of a sense array with multiple TX patterns. The apparatus further comprises a de-convolution circuit block coupled to the memory device. The de-convolution circuit block is configured to de-convolve the convolved capacitance data with inverses of the multiple TX patterns to obtain capacitance data for a de-convolved capacitance map. In mathematics and functional analysis, convolution is a mathematical operation on two functions that produce a third function that is typically viewed as a modified version of one of the original functions. Computing the inverse of the convolution is known as de-convolution (also referred to as deconvolution). As described herein, the hardware de-convolves the convolved data resulting from the multi-phase scanning.

Touchscreen sensing techniques measure changes in capacitance on an array of intersections of a touchscreen panel. An intersection between two sense elements may be understood as a location at which one sense electrode crosses over or overlaps another, while maintaining galvanic isolation from each other. Conventional scanning techniques would transmit a single transmit (TX) signal output on one axis and receive on receive (RX) channels on the other axis. This would be repeated for each TX output. The embodiments described herein are directed to improving signal-to-noise ratio (SNR) without decreasing refresh rate by using an alternative drive mechanism for TX signals for panel scanning. These multi-phase scanning techniques are based on applying the TX signal to some or all of the panel electrodes at the same time and changing the individual TX electrode phases for different scanning states. Multi-phase TX scanning achieves a significant improvement in SNR by driving multiple TX lines (M) simultaneously which results in SNR improvement. As a result of the multi-phase scanning, a capacitance map can be stored in memory of the RX lines, which are subjected to the multiple driven TX lines. The capacitance map can be created by a touch screen controller (TSC) channel engine. Driving a number, n, of TX panel lines simultaneously (TXn) with n drive patterns successively results in a capacitance map with a higher SNR, than driving n TX panel lines one at a time. The capacitance map, however, when initially stored in memory is convolved. Before finger position processing by a host, such as a processor core (e.g., CPU) of the TSC device or a host coupled to the TSC device, the capacitance map needs to be de-convolved. De-convolution is the inverse of the multi-phase TX operations, as defined by the drive patterns of the driven TX lines. The de-convolution is done in the embodiments described herein in hardware of the TSC device in order to reduce the processing load on the processor core (CPU) and to improve processing time. De-convolution can also be performed as an algorithm in firmware on the TSC device or firmware of the processor core if the processing capability is available.

FIG. 1 is a block diagram illustrating one embodiment of an electronic system 100 having a processing device 110 including de-convolution circuit block 120. Details regarding the de-convolution circuit block 120 are described in more detail with respect to FIGS. 2-13. In short, the de-convolution circuit block 120 is configured to de-convolve the convolved capacitance data with inverses of the multiple TX patterns to obtain capacitance data for a de-convolved capacitance map. The de-convolution circuit block 120 may be part of the capacitance-sensing circuit 101 or may be a separate circuit from the capacitance-sensing circuit 101 as illustrated in FIG. 1.

The processing device 110 is configured to detect one or more touches on a touch-sensing device, such as the capacitive sense array 125. The processing device can detect conductive objects, such as touch objects 140 (fingers or passive styluses, an active stylus 130, or any combination thereof. The capacitance-sensing circuit 101 can measure touch data on the capacitive sense array 125. The touch data may be represented as multiple cells, each cell representing an intersection of sense elements (e.g., electrodes) of the capacitive sense array 125. In another embodiment, the touch data is a 2D capacitive image of the capacitive sense array 125. In one embodiment, when the capacitance-sensing circuit 101 measures mutual capacitance of the touch-sensing device (e.g., capacitive sense array 125), the capacitance-sensing circuit 101 obtains a 2D capacitive image of the touch-sensing device and processes the data for peaks and positional information. In another embodiment, the processing device 110 is a microcontroller that obtains a capacitance touch signal data set, such as from a sense array, and finger detection firmware executing on the microcontroller identifies data set areas that indicate touches, detects and processes peaks, calculates the coordinates, or any combination therefore. The firmware identifies the peaks using the embodiments described herein. The firmware can calculate a precise coordinate for the resulting peaks. In one embodiment, the firmware can calculate the precise coordinates for the resulting peaks using a centroid algorithm, which calculates a centroid of the touch, the centroid being a center of mass of the touch. The centroid may be an X/Y coordinate of the touch. Alternatively, other coordinate interpolation algorithms may be used to determine the coordinates of the resulting peaks. The microcontroller can report the precise coordinates to a host processor, as well as other information.

Electronic system 100 includes processing device 110, capacitive sense array 125, stylus 130, host processor 150, embedded controller 160, and non-capacitive sense elements 170. The capacitive sense elements are electrodes of conductive material, such as copper. The sense elements may also be part of an ITO panel. The capacitive sense elements can be configurable to allow the capacitive-sensing circuit 101 to measure self-capacitance, mutual capacitance, or any combination thereof. In the depicted embodiment, the electronic system 100 includes the capacitive sense array 125 coupled to the processing device 110 via bus 122. The capacitive sense array 125 may include a multi-dimension capacitive sense array. The multi-dimension sense array includes multiple sense elements, organized as rows and columns. In another embodiment, the capacitive sense array 125 operates as an all-points-addressable ("APA") mutual capacitive sense array. In another embodiment, the capacitive sense array 125 operates as a coupled-charge receiver. In another embodiment, the capacitive sense array 125 is non-transparent capacitive sense array (e.g., PC touchpad). The capacitive sense array 125 may be disposed to have a flat surface profile. Alternatively, the capacitive sense array 125 may have non-flat surface profiles. Alternatively, other configurations of capacitive sense arrays may be used. For example, instead of vertical columns and horizontal rows, the capacitive sense array 125 may have a hexagon arrangement, or the like, as would be appreciated by one of ordinary skill in the art having the benefit of this disclosure. In one embodiment, the capacitive sense array 125 may be included in an ITO panel or a touch screen panel.

The operations and configurations of the processing device 110 and the capacitive sense array 125 for detecting and tracking the touch object 140 and stylus 130 are described herein. In short, the processing device 110 is configurable to detect a presence of the touch object 140, a presence of a stylus 130 on the capacitive sense array 125, or any combination thereof. The processing device 110 may detect and track the stylus 130 and the touch object 140 individually on the capacitive sense array 125. In one embodiment, the processing device 110 can detect and track both the stylus 130 and touch object 140 concurrently on the capacitive sense array 125. If the touching object is an active stylus, in one embodiment, the active stylus 130 is configurable to operate as the timing "master," and the processing device 110 adjusts the timing of the capacitive sense array 125 to match that of the active stylus 130 when the active stylus 130 is in use. In one embodiment, the capacitive sense array 125 capacitively couples with the active stylus 130, as opposed to conventional inductive stylus applications. It should also be noted that the same assembly used for the capacitive sense array 125, which is configurable to detect touch objects 140, is also used to detect and track a stylus 130 without an additional PCB layer for inductively tracking the active stylus 130.

In the depicted embodiment, the processing device 110 includes analog and/or digital general purpose input/output ("GPIO") ports 107. GPIO ports 107 may be programmable. GPIO ports 107 may be coupled to a Programmable Interconnect and Logic ("PIL"), which acts as an interconnect between GPIO ports 107 and a digital block array of the processing device 110 (not shown). The digital block array may be configurable to implement a variety of digital logic circuits (e.g., DACs, digital filters, or digital control systems) using, in one embodiment, configurable user modules ("UMs"). The digital block array may be coupled to a system bus. Processing device 110 may also include memory, such as random access memory ("RAM") 105 and program flash 104. RAM 105 may be static RAM ("SRAM"), and program flash 104 may be a non-volatile storage, which may be used to store firmware (e.g., control algorithms executable by processing core 102 to implement operations described herein). Processing device 110 may also include a memory controller unit ("MCU") 103 coupled to memory and the processing core 102. The processing core 102 is a processing element configured to execute instructions or perform operations. The processing device 110 may include other processing elements as would be appreciated by one of ordinary skill in the art having the benefit of this disclosure. It should also be noted that the memory may be internal to the processing device or external to it. In the case of the memory being internal, the memory may be coupled to a processing element, such as the processing core 102. In the case of the memory being external to the processing device, the processing device is coupled to the other device in which the memory resides as would be appreciated by one of ordinary skill in the art having the benefit of this disclosure.

The processing device 110 may also include an analog block array (not shown). The analog block array is also coupled to the system bus. Analog block array may also be configurable to implement a variety of analog circuits (e.g., ADCs or analog filters) using, in one embodiment, configurable UMs. The analog block array may also be coupled to the GPIO 107.

As illustrated, capacitance-sensing circuit 101 may be integrated into processing device 110. Capacitance-sensing circuit 101 may include analog I/O for coupling to an external component, such as touch-sensor pad (not shown), capacitive sense array 125, touch-sensor slider (not shown), touch-sensor buttons (not shown), and/or other devices. The capacitance-sensing circuit 101 may be configurable to measure capacitance using mutual-capacitance sensing techniques, self-capacitance sensing technique, charge coupling techniques or the like. In one embodiment, capacitance-sensing circuit 101 operates using a charge accumulation circuit, a capacitance modulation circuit, or other capacitance sensing methods known by those skilled in the art. In an embodiment, the capacitance-sensing circuit 101 is of the Cypress TMA-3xx, TMA-4xx, or TMA-xx families of touch screen controllers. Alternatively, other capacitance-sensing circuits may be used. The mutual capacitive sense arrays, or touch screens, as described herein, may include a transparent, conductive sense array disposed on, in, or under either a visual display itself (e.g. LCD monitor), or a transparent substrate in front of the display. In an embodiment, the TX and RX electrodes are configured in rows and columns, respectively. It should be noted that the rows and columns of electrodes can be configured as TX or RX electrodes by the capacitance-sensing circuit 101 in any chosen combination. In one embodiment, the TX and RX electrodes of the sense array 125 are configurable to operate as a TX and RX electrodes of a mutual capacitive sense array in a first mode to detect touch objects, and to operate as electrodes of a coupled-charge receiver in a second mode to detect a stylus on the same electrodes of the sense array. The stylus, which generates a stylus TX signal when activated, is used to couple charge to the capacitive sense array, instead of measuring a mutual capacitance at an intersection of a RX electrode and a TX electrode (a sense element) as done during mutual-capacitance sensing. An intersection between two sense elements may be understood as a location at which one sense electrode crosses over or overlaps another, while maintaining galvanic isolation from each other. The capacitance-sensing circuit 101 does not use mutual-capacitance or self-capacitance sensing to measure capacitances of the sense elements when performing a stylus sensing. Rather, the capacitance-sensing circuit 101 measures a charge that is capacitively coupled between the sense array 125 and the stylus as described herein. The capacitance associated with the intersection between a TX electrode and an RX electrode can be sensed by selecting every available combination of TX electrode and RX electrode. When a touch object, such as a finger or stylus, approaches the capacitive sense array 125, the object causes a decrease in mutual capacitance between some of the TX/RX electrodes. In another embodiment, the presence of a finger increases the coupling capacitance of the electrodes. Thus, the location of the finger on the capacitive sense array 125 can be determined by identifying the RX electrode having a decreased coupling capacitance between the RX electrode and the TX electrode to which the TX signal was applied at the time the decreased capacitance was measured on the RX electrode. Therefore, by sequentially determining the capacitances associated with the intersection of electrodes, the locations of one or more inputs can be determined. It should be noted that the process can calibrate the sense elements (intersections of RX and TX electrodes) by determining baselines for the sense elements. It should also be noted that interpolation may be used to detect finger position at better resolutions than the row/column pitch as would be appreciated by one of ordinary skill in the art having the benefit of this disclosure. In addition, various types of coordinate interpolation algorithms may be used to detect the center of the touch as would be appreciated by one of ordinary skill in the art having the benefit of this disclosure.

In an embodiment, the electronic system 100 may also include non-capacitive sense elements 170 coupled to the processing device 110 via bus 171 and GPIO port 107. The non-capacitive sense elements 170 may include buttons, light emitting diodes ("LEDs"), and other user interface devices, such as a mouse, a keyboard, or other functional keys that do not use capacitance sensing. In one embodiment, buses 122, and 171 are embodied in a single bus. Alternatively, these buses may be configured into any combination of one or more separate buses.

Processing device 110 may include internal oscillator/clocks 106 and communication block ("COM") 108. In another embodiment, the processing device 110 includes a spread spectrum clock (not shown). The oscillator/clocks block 106 provides clock signals to one or more of the components of processing device 110. Communication block 108 may be used to communicate with an external component, such as a host processor 150, via host interface ("I/F") line 151. Alternatively, processing device 110 may also be coupled to embedded controller 160 to communicate with the external components, such as host processor 150. In one embodiment, the processing device 110 is configurable to communicate with the embedded controller 160 or the host processor 150 to send and/or receive data.

Processing device 110 may reside on a common carrier substrate such as, for example, an integrated circuit ("IC") die substrate, a multi-chip module substrate, or the like. Alternatively, the components of processing device 110 may be one or more separate integrated circuits and/or discrete components. In one exemplary embodiment, processing device 110 is the Programmable System on a Chip (PSoC®) processing device, developed by Cypress Semiconductor Corporation, San Jose, Calif. Alternatively, processing device 110 may be one or more other processing devices known by those of ordinary skill in the art, such as a microprocessor or central processing unit, a controller, special-purpose processor, digital signal processor ("DSP"), an application specific integrated circuit ("ASIC"), a field programmable gate array ("FPGA"), or the like.

It should also be noted that the embodiments described herein are not limited to having a configuration of a processing device coupled to a host, but may include a system that measures the capacitance on the sensing device and sends the raw data to a host computer where it is analyzed by an application. In effect, the processing that is done by processing device 110 may also be done in the host.

Capacitance-sensing circuit 101 may be integrated into the IC of the processing device 110, or alternatively, in a separate IC. Alternatively, descriptions of capacitance-sensing circuit 101 may be generated and compiled for incorporation into other integrated circuits. For example, behavioral level code describing the capacitance-sensing circuit 101, or portions thereof, may be generated using a hardware descriptive language, such as VHDL or Verilog, and stored to a machine-accessible medium (e.g., CD-ROM, hard disk, floppy disk, etc.). Furthermore, the behavioral level code can be compiled into register transfer level ("RTL") code, a netlist, or even a circuit layout and stored to a machine-accessible medium. The behavioral level code, the RTL code, the netlist, and the circuit layout may represent various levels of abstraction to describe capacitance-sensing circuit 101.

It should be noted that the components of electronic system 100 may include all the components described above. Alternatively, electronic system 100 may include some of the components described above.

In one embodiment, the electronic system 100 is used in a tablet computer. Alternatively, the electronic device may be used in other applications, such as a notebook computer, a mobile handset, a personal data assistant ("PDA"), a keyboard, a television, a remote control, a monitor, a handheld multi-media device, a handheld media (audio and/or video) player, a handheld gaming device, a signature input device for point of sale transactions, an eBook reader, global position system ("GPS") or a control panel. The embodiments described herein are not limited to touch screens or touch-sensor pads for notebook implementations, but can be used in other capacitive sensing implementations, for example, the sensing device may be a touch-sensor slider (not shown) or touch-sensor buttons (e.g., capacitance sensing buttons). In one embodiment, these sensing devices include one or more capacitive sensors or other types of capacitance-sensing circuitry. The operations described herein are not limited to notebook pointer operations, but can include other operations, such as lighting control (dimmer), volume control, graphic equalizer control, speed control, or other control operations requiring gradual or discrete adjustments. It should also be noted that these embodiments of capacitive sensing implementations may be used in conjunction with non-capacitive sensing elements, including but not limited to pick buttons, sliders (ex. display brightness and contrast), scroll-wheels, multi-media control (ex. volume, track advance, etc.) handwriting recognition, and numeric keypad operation.

Figure 2:
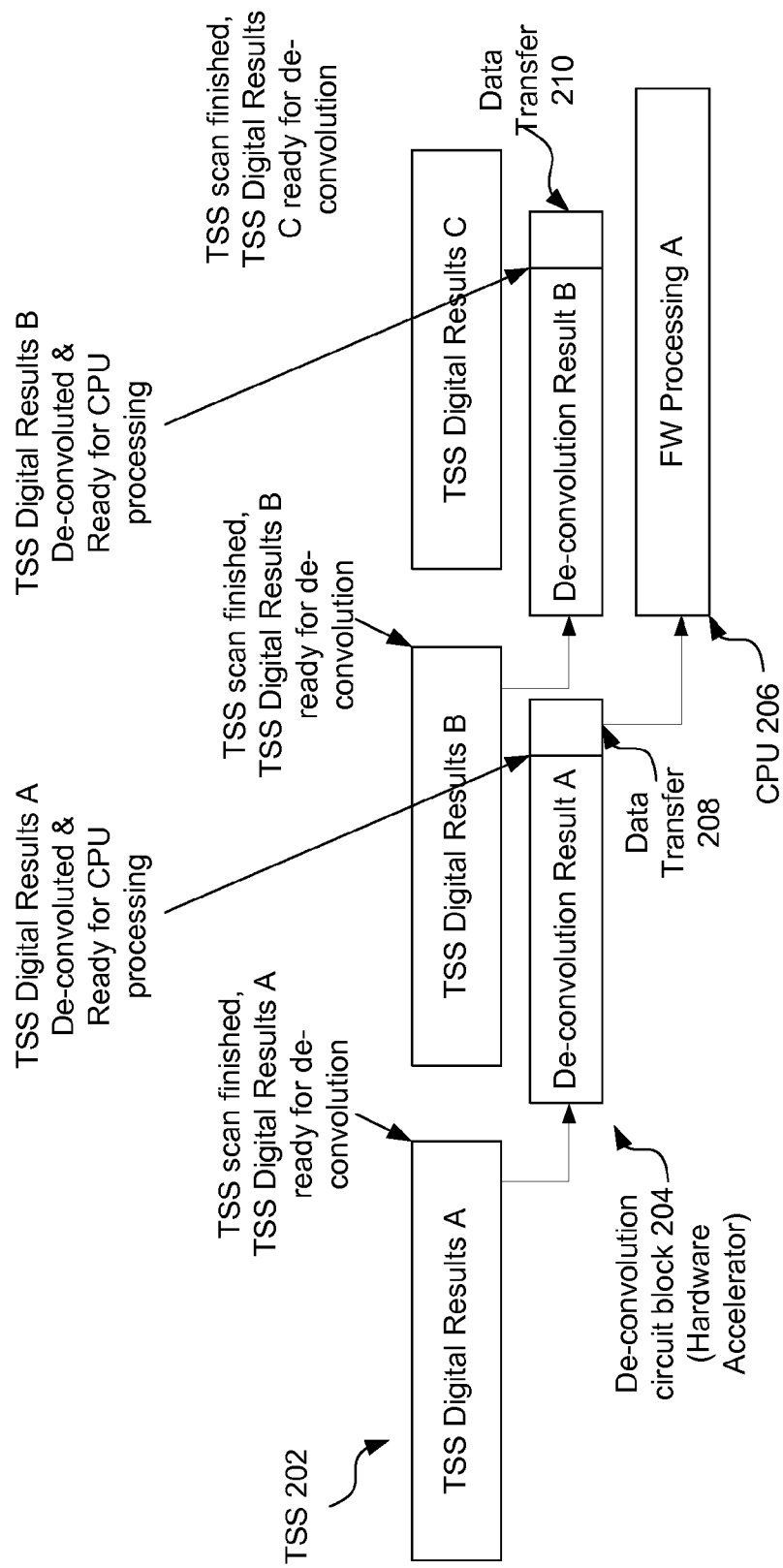
FIG. 2 illustrates a de-convolution circuit block reducing a load on a central processing unit (CPU) according to one embodiment.

FIG. 2 illustrates a de-convolution circuit block 204 reducing a load on a CPU according to one embodiment. In this embodiment, the de-convolution circuit block 204 is a hardware accelerator for a de-convolution algorithm that was previously run on a CPU 206. Because of the scaling of the processing function with increasing TX/RX electrodes for large touchscreens, the de-convolution circuit block 204 can more efficiently perform the de-convolution function than when performed by the CPU 206. In this embodiment, CPU loading is reduced, allowing the CPU 206 to perform other tasks while waiting for the de-convolved results calculated by the de-convolution circuit block 204. In particular, a touch-screen subsystem (TSS) 202 of a touch screen controller (TSC) performs multi-phase TX scanning of a sense array and obtains TSS digital results A in a first scan. When the TSS 202 is finished with the scan, the TSS digital results A are ready for de-convolution and the de-convolution circuit block 204 obtains the de-convolution results A and performs a data transfer 208 to the CPU 206. The data transfer 208 can be an interrupt to indicate to the CPU 206 that the TSS digital results A are de-convolved and ready for CPU processing. The CPU 206 can then perform other processing on the de-convolved results A. While the de-convolution circuit block 204 is obtaining the de-convolution results A, the TSS 202 can perform another scan to obtain TSS digital results B. When the TSS 202 is finished, the TSS digital results B are ready for de-convolution and the de-convolution circuit block 204 obtains the de-convolution results B and performs another data transfer 210. TSS 202 can obtain the digital results C and the de-convolution circuit block 204 can obtain the de-convolved results C (not illustrated), and so on. In another embodiment, the processing device 110 includes a memory device and a de-convolution circuit block coupled to the memory device. The memory device is configured to store a capacitance map including convolved capacitance data. The convolved data is a result of multi-phase TX scanning of a sense array with multiple TX patterns. The de-convolution circuit block is configured to de-convolve the convolved capacitance data with inverses of the multiple TX patterns to obtain capacitance data for a de-convolved capacitance map.

In a further embodiment, the de-convolution circuit block includes registers to store programmable coefficients. The programmable coefficients represent the inverse of the multiple TX patterns and implement a de-convolution algorithm to de-convolve the convolved capacitance data. In a further embodiment, the registers are further configured to store the multiple TX patterns. Each of the TX patterns includes an element for the TX drive lines of the sense array. The element is at least one of a first value that indicates a TX pulse signal for the given TX drive line; a second value indicates an inverse TX pulse signal for the given TX drive line; or a third value that indicates no TX pulse signal for the given TX drive line. In one embodiment, the TX patterns include the following four TX patterns:

TX pattern 0: +1, +1, +1, −1;
TX Pattern 1: −1, +1, +1, +1;
TX Pattern 2: +1, −1, +1, +1; and
TX Pattern 3: +1, +1, −1, +1.

In one embodiment, the four TX patterns form a first multi-phase group, and a second multi-phase group includes zeros.

In another embodiment, the TX patterns include a first set of TX patterns as follows and a second set of TX patterns as follows:

In another embodiment, the TX pattern includes a first set of TX patterns and a second set of TX patterns as follows:

First Set:
TX pattern 0: +1, +1, +1, −1, 0, 0, 0, 0;
TX Pattern 1: −1, +1, +1, +1, 0, 0, 0, 0;
TX Pattern 2: +1, −1, +1, +1, 0, 0, 0, 0; and
TX Pattern 3: +1, +1, −1, +1, 0, 0, 0, 0.
Second Set:
TX pattern 0: 0, 0, 0, 0, +1, +1, +1, −1;
TX Pattern 1: 0, 0, 0, 0, −1, +1, +1, +1;
TX Pattern 2: 0, 0, 0, 0, +1, −1, +1, +1; and
TX Pattern 3: 0, 0, 0, 0, +1, +1, −1, +1.

Although the above TX patterns illustrate specific multi-phase sequences, a predefined set of multi-phase sequences can be preloaded for hardware accelerator operation. In one embodiment, the de-convolution circuit block 204 is configured to perform in-place de-convolution in which the convolved capacitance data is overwritten in the memory device with the capacitance data after the de-convolution.

In another embodiment, the capacitance map includes a number, T, TX patterns and R RX lines as specified in memory-mapped input-output (MMIO) register fields. The multi-phase TX scanning includes a multi-phase identifier, n, with T being an integer of n, where n is specified in another MMIO register field, and wherein additional MMIO register fields store multiple programmable coefficients for the de-convolution process.

In a further embodiment, the de-convolution circuit block 204 includes an accumulator to hold an in-between result of a de-convolution calculation. The de-convolution calculation multiplies a value of the convolved capacitance data in the capacitance map with a corresponding one of the programmable coefficients to obtain a result. The sum of the result of several de-convolution calculations is an accumulator value. That is the accumulator value is the sum of the result of several of the operations described above where a convolved capacitance data in the capacitance map is multiplied by a corresponding of the programmable coefficients. A final de-convolution result is calculated by clipping the accumulator value to a positive range and scaling the accumulator value, as described herein. In one embodiment, the accumulator includes x bits with a range of $[-2^x, 2^x-1]$. The final de-convolution result is calculated by clipping the accumulator value to the positive range $[0, 2^x-1]$ and dividing by a normalize value, $2^{(x/2)}$, to scale the accumulator value. In other implementations, the final de-convolution result could be negative, for example, when the convolved capacitance map data is negative.

In a further embodiment, the de-convolution circuit block 204 is configured to issue an interrupt to a CPU to indicate a de-convolved capacitance map is available for further processing by the CPU. In one embodiment, the CPU is part of the processing device 110 (e.g., processing core 102). In another embodiment, the CPU is not part of the processing device 110 (e.g., host processor 150).

In another embodiment, the de-convolution circuit block 204 is configured to perform extra de-convolution results when a number of TX lines is not a multiple of four and eight, such as illustrated below with respect to FIG. 9. In other embodiments, any order of multi-phase TX scanning could be used.

In another embodiment, the processing device is a touchscreen controller (TSC) that includes a capacitance-sensing circuit, a memory device coupled to the capacitance-sensing circuit and a programmable digital circuit block. The capacitance-sensing circuit is configured to obtain a capacitance map including a capacitance of an intersection of a TX electrode and a RX electrode of a touchscreen. The capacitance map is convolved as a result of a multi-phase TX scanning of the sense array. The memory device is configured to store the capacitance map. The programmable digital circuit block includes a register including register fields to store a programmable coefficients for de-convolution calculations and a de-convolution engine configured to perform the de-convolution calculations of the capacitance map using the programmable coefficients to obtain a de-convolved capacitance map and to issue an interrupt to indicate an availability of the de-convolved capacitance map to a processor core when the de-convolution calculations are performed. In one embodiment, the de-convolution circuit block includes an accumulator. In another embodiment, the register fields are memory-mapped input-output (MMIO) register fields. The MMIO register fields are configured to store at least one of an amount of TX patterns used in the multi-phase TX scanning; an amount of RX lines of the sense array; a multi-phase identifier that identifies a current one of the TX patterns used in the multi-phase TX scanning; de-convolution coefficients; multi-phase TX scanning identifiers; polarity control for each TX electrode of the touchscreen; or the like.

Figure 3:
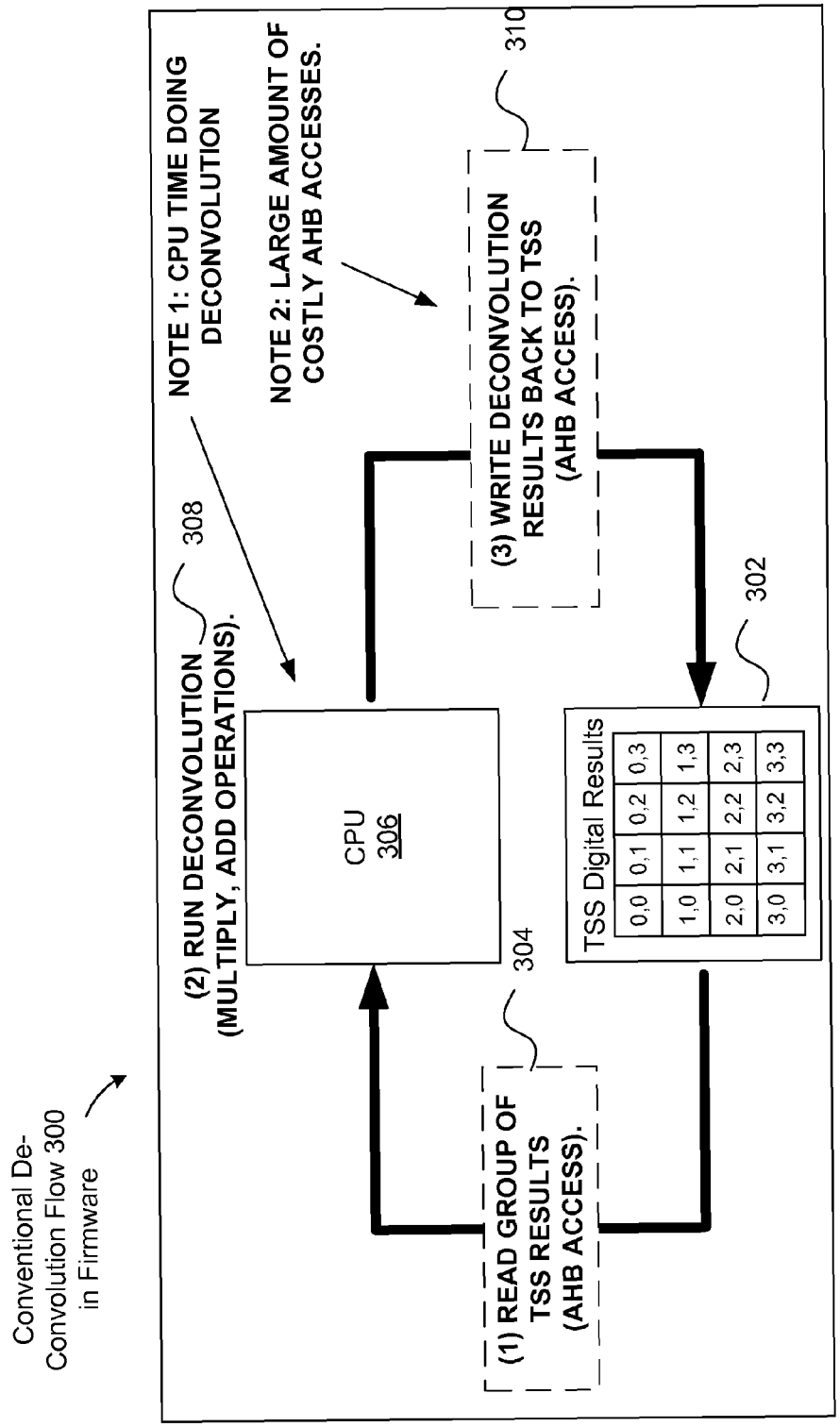
FIG. 3 illustrates a conventional de-convolution flow in firmware according to one implementation.

FIG. 3 illustrates a conventional de-convolution flow 300 in firmware according to one implementation. In the de-convolution flow 300, TSS digital results are stored in memory 302 of a TSS and the CPU 306 reads a group of TSS results stored in memory 302 (block 304). For example, the reads at block 304 can be AHB accesses on the ARM AHB bus to Cortex™ M core. The CPU 306 runs the de-convolution algorithm, including multiply and add operations, on the read TSS results (block 308). The CPU 306 writes the de-convolution results back to the memory 302 of the TSS (block 310). These write at block 310 can be AHB accesses. It should be noted that the CPU 306 performing the de-convolution algorithm consumes CPU time and the reads at block 304 and writes at block 310 involve a large amount of costly data transfers, AHB accesses. Each AHB access cost approximately five clock cycles, which is very expensive and time consuming for the CPU 406.

Figure 4:
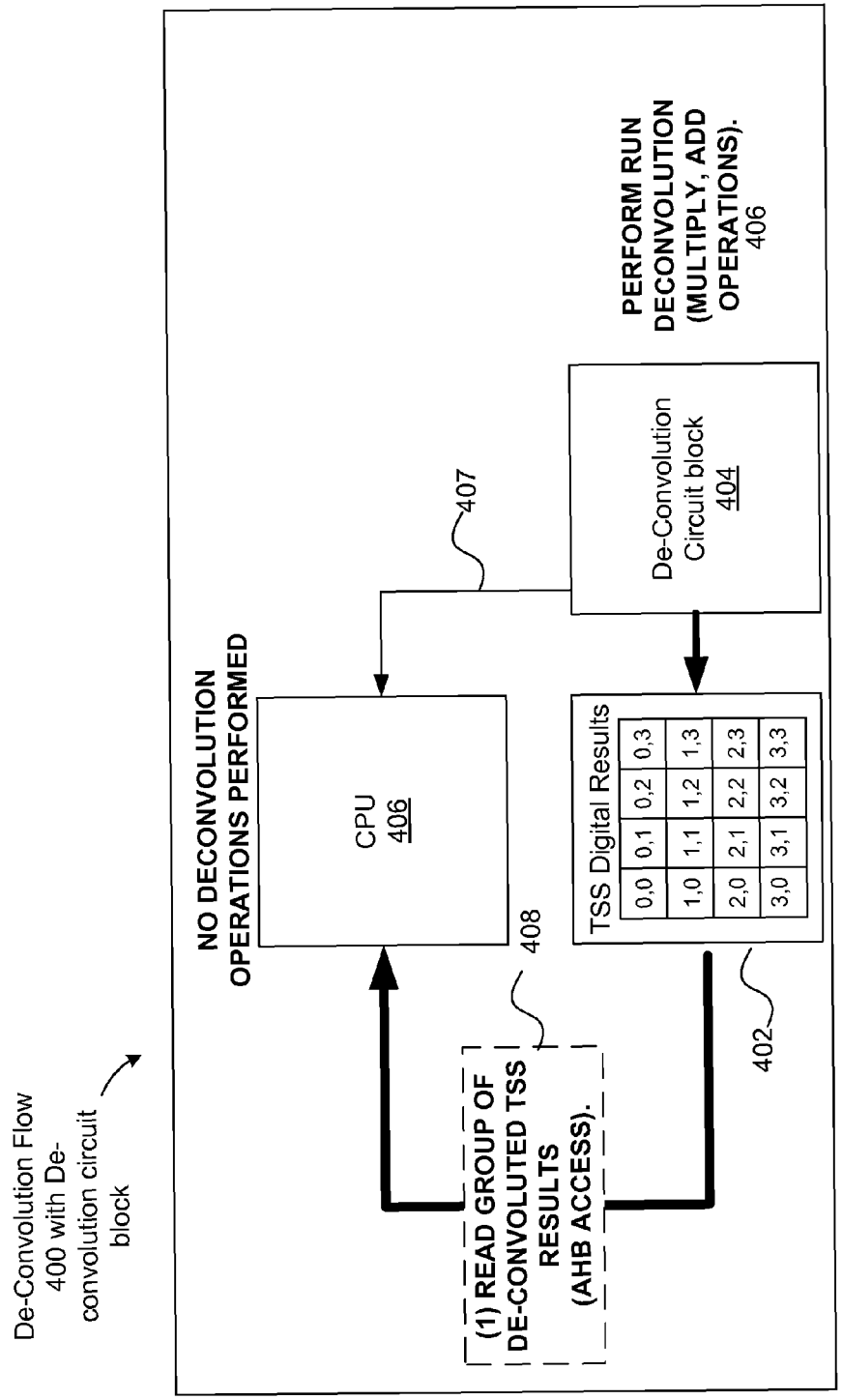
FIG. 4 illustrates a de-convolution flow with a de-convolution circuit block according to one embodiment.

FIG. 4 illustrates a de-convolution flow 400 with a de-convolution circuit block according to one embodiment. In the de-convolution flow 400, TSS digital results are stored in memory 402 of a TSS. Instead of the CPU 406 reading and performing the de-convolution algorithm, the de-convolution circuit block 404 performs the convolution algorithm, including the multiply and add operations (block 406) and stores the de-convolved digital results in the memory 402. The de-convolution circuit block 404 can notify the CPU 406 that de-convolved digital results are available for further processing (block 407), and the CPU 406 reads a group of de-convolved TSS results stored in memory 402 (block 408). For example, the reads at block 408 can be AHB accesses on the ARM AHB bus to Cortex™ M core. It should be noted that the data transfer at block 407 is much less than the data transfers needed to read the results by the CPU and to write the results back into the memory as described with respect to FIG. 3. It should be noted that because the CPU 406 does not perform the de-convolution algorithm, the de-convolution process does not consume CPU time for the de-convolution algorithm and writing the de-convolved results back to memory. Thus, the CPU 406 is free to perform other tasks while the de-convolution circuit block 404 performs the de-convolution algorithm, and reduces the number costly data transfers between the memory 402 and the CPU 406. For example, in de-convolution flow 400, there are no AHB accesses to write the de-convolved results back into memory 404.

In a further embodiment, the memory 402 stores the TSS digital results as a capacitance map and the de-convolution circuit block 404 re-uses the capacitance maps, which initially stored the convolved results, to store the de-convolved results. The de-convolution circuit block in the TSS allows the TSS to access the capacitance map in memory (e.g., static random access memory (SRAM)) in a single clock cycle, rather than having multiple AHB accesses by the CPU (e.g., 306) to read the convolved results and running the de-convolution algorithm in firmware of the CPU 406. In one embodiment, the de-convolution flow 400 does not require AHB accesses for de-convolution other than initializing the de-convolution circuit block 404.

Figure 5:
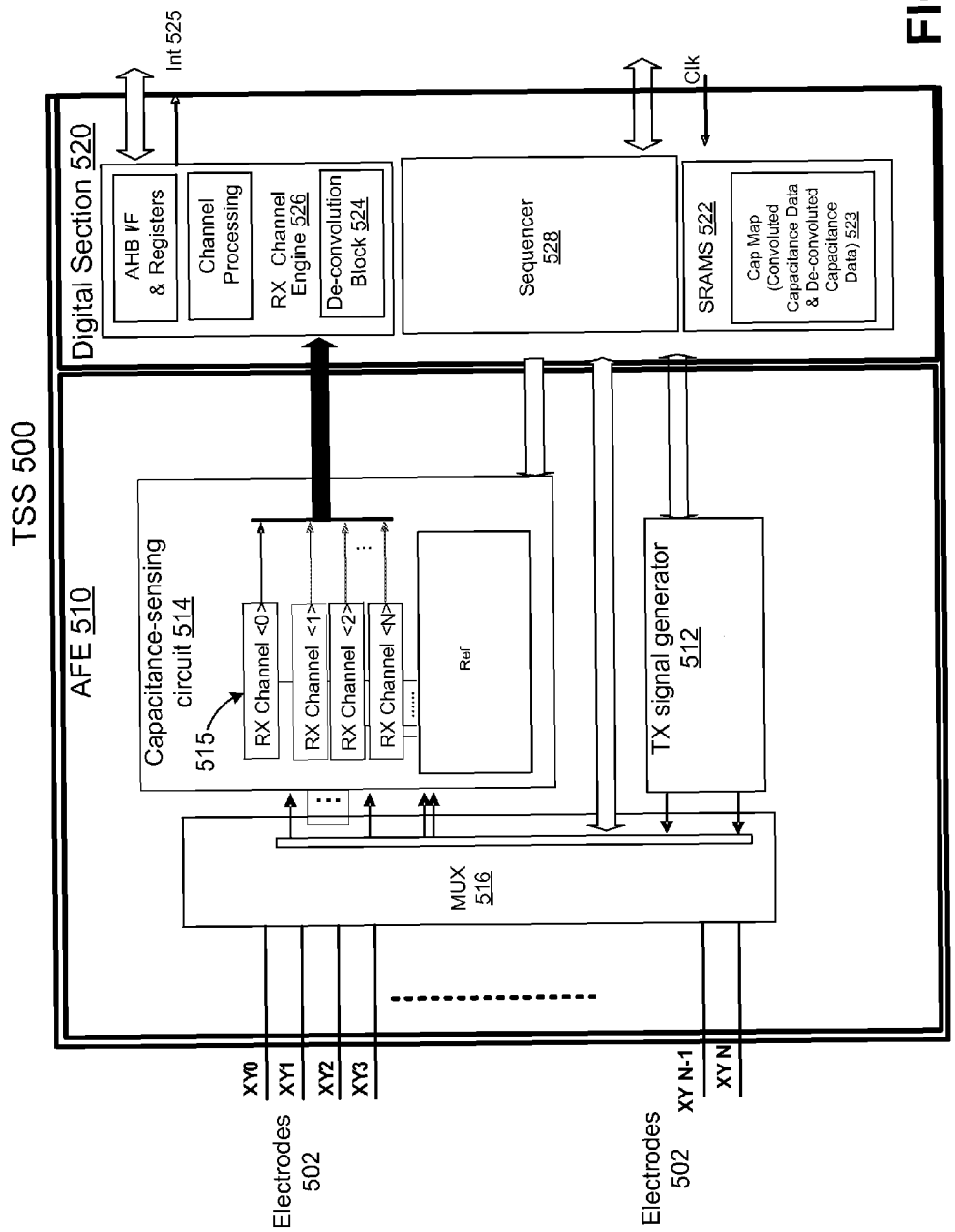
FIG. 5 illustrates a touchscreen subsystem (TSS) of a touchscreen controller (TSC) including a de-convolution circuit block according to one embodiment.

FIG. 5 illustrates a touchscreen subsystem (TSS) 500 of a touchscreen controller (TSC) including a de-convolution circuit block 504 according to one embodiment. The TSS 500 includes an analog front end (AFE) 510 and a digital section 520. The AFE 510 includes a TX signal generator 512, a capacitance-sensing circuit 514 and a multiplexer 516 (e.g., MUX). The TX signal generator 512 is configured to generate one or more TX signals to be applied to one or more electrodes 502 via the multiplexer 516 (e.g., switch matrix). The multiplexer 516 allows the electrodes 502 to be coupled to the TX signal generator 512 or the RX channels 515 of the capacitance-sensing circuit 514. In this manner, each electrode can be configured or re-configured as a TX electrode or a RX electrode. The capacitance-sensing circuit 514 includes the RX channels 515, as well as some other analog circuits for measuring and converting capacitance to digital values. The capacitance-sensing circuit 514 stores the digital values into memory 522 of the digital section 520 via RX channel engine 526.

In one embodiment, the TX pulse of the TX signal generator 512 is derived from a voltage VDDA or VCCTX, which powers an array of N configurable RX or TX drivers in the multiplexer 516 connected to the electrodes 502 of the touchscreen panel. The multiplexer 516 can also be reconfigured to receive the signal from the touchscreen panel and the coupled charge is integrated and converted into a digital result by each RX channel 515. This signal is a measure of the relative capacitance of the touchscreen which is modulated by the presence of a touch. There may be a number, M, of RX channels 515 in the AFE 510, allowing the TSS 500 to scan an entire touchscreen panel in one pass. A programmable attenuator may be present in the TSS 500 in front of the RX integrator to avoid channel saturation in the presence of large input noise (coupled from an external charger or LCD) and to present a low impedance input to reduce RX-RX coupling and noise-rectification effects.

The digital section 520 includes the memory 522 (e.g., SRAMs), programmable channel engine 526 (also referred to herein as the RX channel engine), a sequencer 528. The RX channel engine 526 can perform channel processing on the digital values and store and access digital results stored in the memory 522. The RX channel engine 526 also includes a data transfer interface to a communication bus to the digital subsystem, including the CPU (not illustrated in FIG. 5), and registers that can store programmable coefficients used by the de-convolution circuit block 524. Initially, the digital values are stored as convolved capacitance data in a capacitance map 523. As described in more detail below, the de-convolution circuit block 524 can perform de-convolution calculations on the convolved capacitance data using the programmable coefficients and can store the de-convolved data in the capacitance map 523. The de-convolution circuit block 524 (or the RX channel engine 526) can issue an interrupt 525 to a digital subsystem, which includes a CPU or other host processor.

In one embodiment, the AFE 510 can be controlled by the sequencer 528 in the digital section 520 and the digitized outputs of the receivers are fed to a programmable channel engine (CE) which performs digital filtering, windowing and accumulation on the received digitized samples and de-convolution by de-convolution circuit block 524. The sequencer 528 can perform other operations, as shown as the data transfer interface (e.g., AHB I/F) and registers. In other embodiments, the sequencer 528 can control the AFE 510 in other configurations.

The digital section may also include other functional blocks, such as a local maxima engine that detects one or more local maximums in the capacitance data and reports to the digital subsystem.

Figure 6:
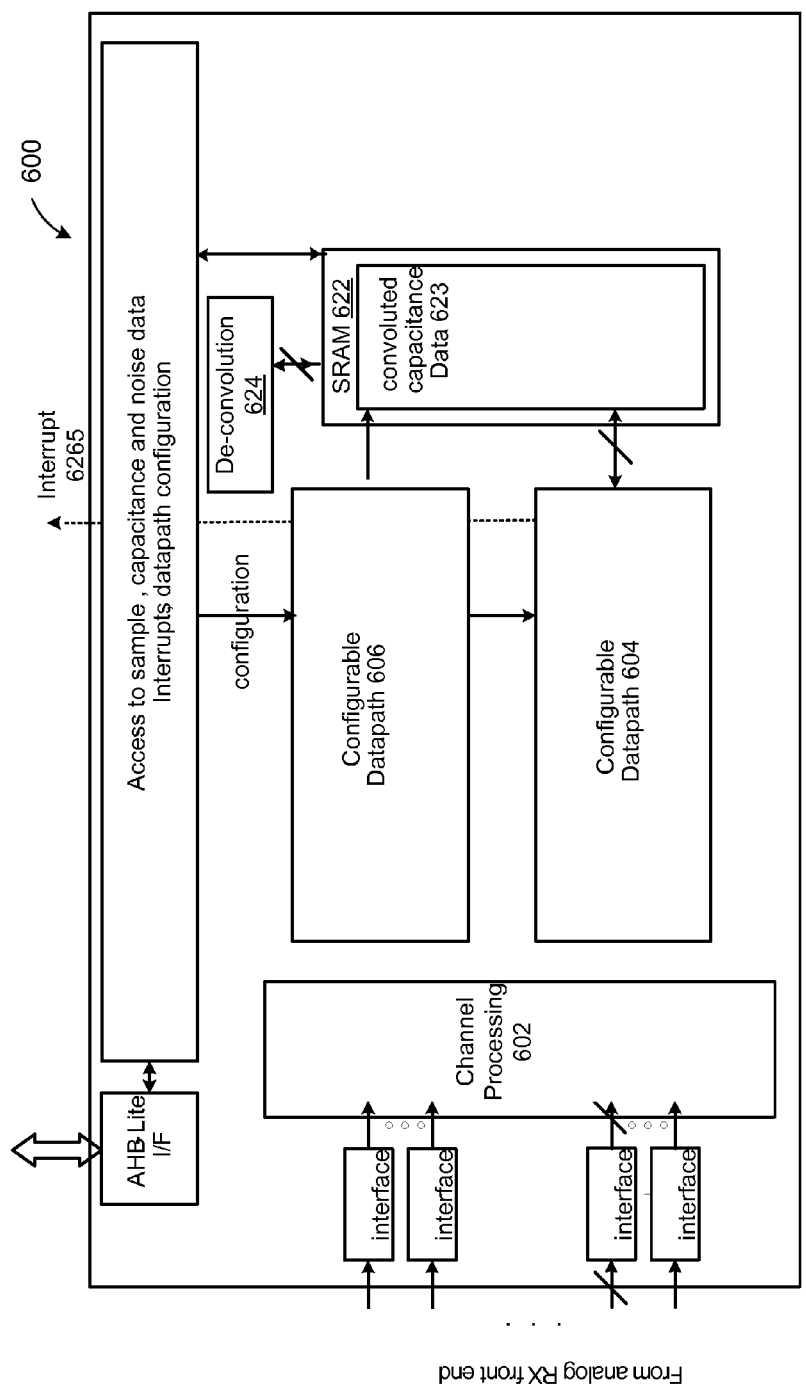
FIG. 6 illustrates a TSS channel engine and a de-convolution circuit block according to one embodiment.

FIG. 6 illustrates a TSS channel engine 600 with a de-convolution circuit block 624 according to one embodiment. In this embodiment, the TSS channel engine 600 receives data from the AFE over one or more interfaces. The TSS channel engine 600 can perform channel processing 602 on the incoming data and can store the data in memory 622 (e.g., SRAM 622). A configurable datapath 604 can be configured to store the digital results as convolved capacitance data 623 in the memory 622. Another data path 606 can be used to sort the digital results, determine a median, maximum and minimum values, a summation of absolute deltas, or the like. Noise data 608, 610 can be stored in the memory 622 as well. The noise data 608, 610 can each include noise data for two patterns, including a minimum, a maximum, and a sum of absolute deltas. Of course, noise data can be stored for additional patterns. The de-convolution circuit block 624 can be started by the sequencer and can access the stored convolved capacitance 623 in the memory 622 and performs the de-convolution algorithm using programmable coefficients from registers. The de-convolution circuit block 624 performs the algorithm on the capacitance data 623 for all TX Patterns and RX channels specified in a control register. In one embodiment, the memory 622 can be provided to have enough space for two capacitance maps. The de-convolution process can replace the convolved capacitance data with de-convolved capacitance data. Once de-convolution is finished by the de-convolution circuit block 624, an interrupt 625 is given to the CPU.

FIG. 7 illustrates a table 700 of two multi-phase groups with multiple TX patterns according to one embodiment. The key to de-convolution is driving multiple TX lines 702 for a particular TX pattern 704. This is referred to as multi-phase TX scanning and the number of TX lines 702 driven simultaneously needs to be programmed in a register. This is demonstrated in table 700 of FIG. 7 for an example with eight physical TX lines 702 (vertical axis in table 700) and a scan that drives the TX lines 702 with eight different TX patterns 704 (horizontal axis in table 700). The table 700 is programmed for a multi-phase TX of four with two multi-phase groups 706, 708. In FIG. 7, a first value, 1, represents the TX pulse, a second value, −1, represents an inverse TX pulse, and a third value, 0, represents no TX pulse. The generation of the TX pulse can be done via a register which defines which physical TX lien 702 is to be driven. De-convolution is the inverse of the multi-phase TX operations (as defined by the drive patterns). De-convolution is performed with programmable coefficients, which represents the inverse matrix of the multi-phase TX scanning used.

In one embodiment, a maximum de-convolution order n (indicating the amount of TX lines driven simultaneously) is TX_MAX_NR (the amount of TX electrodes of the maximum supported panel). Multi-phase TX drives multiple TX panel lines simultaneously, rather than one TX panel line at a time. The simultaneously driven TX panel lines have a phase relationship: they are either in phase (represented by +1) or have opposite phase (represented by −1). The phases of the driven TX lines make up a drive pattern. Driving n TX panel lines simultaneously (TXn) with n drive patterns successively results in a capacitance map with a higher SNR, than driving n TX panel lines one at a time. Note that in both cases the scanning time is the same: n TX patterns. The de-convolution circuit block can use a multi-phase identifier n that is typically greater or equal to 3. As an example, for multi-phase TX4 (4 simultaneously driven panel electrodes), the following drive patterns are possible:

TX pattern 0: +1 +1 +1 −1
TX pattern 1: −1 +1 +1 +1
TX pattern 2: +1 −1 +1 +1
TX pattern 3: +1 +1 −1 +1

Note that multi-phase TX scanning can subject every RX line to multiple driven TX lines. As a result, the capacitance map as created by the channel engine's datapath is convolved. Before the CPU can further process the capacitance map, the capacitance map needs to be de-convolved. De-convolution is the inverse of the multi-phase TX operations (as defined by the drive patterns). In one embodiment, the de-convolution circuit block performs an in-place de-convolution on the capacitance map in which the convolved data elements are overwritten by de-convolved data elements.

In another embodiment, considering a map of T TX patterns and R RX lines, the amount of TX patterns and the amount of RX lines is specified through memory-mapped input-output (MMIO) register fields. Furthermore, assuming multi-phase TXn, with T being an integer multiple of n, the multi-phase identifier n is also specified through a MMIO register field. A convolved capacitance map data element at the intersection of TX pattern t and RX line r may be identified by conv_cap[t, r] and a de-convolved capacitance map data element at the intersection of TX pattern t and RX line r is identified by cap[t, r] as set for the in the following pseudo-code that represents the de-convolution algorithm performed by the de-convolution circuit block. The de-convolution operation use n coefficients.

In the following example, the coefficients are approximations with 4 decimal-digit accuracy. These coefficients may be specified by MMIO registers and are represented as 16-bit values with a two-complement representation (range: [−32768, 32767]). For example, the encoding of the coefficients may be as follows:

16-bit MMIO register value 0, represents coefficient value 0.0.
16-bit MMIO register value 1, represents coefficient value 1/32768=0.0000305 . . .
16-bit MMIO register value 2, represents coefficient value 2/32768=0.0000610 . . .
16-bit MMIO register value 16384, represents coefficient value 16384/32768=0.5.
16-bit MMIO register value 32767, represents coefficient value 32767/32768=0.9999694 . . . This is the biggest representable coefficient value (a little bit less than 1.0).
16-bit MMIO register value −32768, represents coefficient value −32768/32768=−1.0. This is the smallest representable coefficient value.
16-bit MMIO register value −32767, represents coefficient value −32767/32768=−0.9999694 . . .
16-bit MMIO register value −1, represents coefficient value −1/32768=−0.0000305 . . .

It should be noted that the 16-bit (finite) representation introduces slight rounding errors with maximum error of 0.5/32768 per coefficient.

In one embodiment, the de-convolution circuit block includes an accumulator and a multiplier. The multiplier receives an input value, representing one intersection of the capacitance map, and a corresponding programmable coefficient for the intersection per the TX pattern used. The multiplier multiplies these values and the result is input into the accumulator. In one embodiment, the programmable channel engine has two requirements that a) the sum of all the positive MMIO register values is in the range [0, 32767] (i.e., the sum of all the positive coefficient values is in the range [0, 1.0]); and b) the sum of all the negative MMIO register values is in the range [−32768, 0] (i.e., the sum of all the positive coefficient values is in the range [−1.0, 0]). If the above requirements are not met, the de-convolution calculation accumulator may overflow. It may be necessary to down scale the coefficients to ensure that the above two requirements are met. This reduces the precision (and magnitude) of the final result, but this is acceptable.

The convolved capacitance map data elements may be represented as unsigned 16-bit values in the range [0, 65535]. The calculated de-convolved data elements are also represented as 16-bit values. As an example, for multi-phase TX4 (4 simultaneously driven panel electrodes), the following coefficient values may be used: 0.25 0.25 0.25 −0.25, wherein the corresponding MMIO registers are the following: 8192 8192 −8192 8192. In this embodiment, these coefficients meet both requirements. That is a) the sum of the positive coefficient values is 0.75 (sum of all the positive MMIO register values is 24576) and b) the sum of the negative coefficient values is −0.25 (sum of all the negative MMIO register values is −8192).

In another embodiment, there is a possibility to up scale the coefficients a bit, which would improve the precision (and magnitude) of the final result.

In one embodiment, the de-convolution circuit block uses an accumulator that holds the in-between results of the de-convolution calculation. This is done without loss of precision (as long as the two requirements are met). The final de-convolution result may be calculated by clipping and scaling the accumulator value. This last step may introduce a loss of precision.

In one embodiment, the accumulator has 32 bits, which may be enough to hold the in-between results without loss of precision. This is explained based on the observation that the biggest convolved data element value is 65535, the biggest accumulator value is less than 32367 (requirement a)*65535 and the smallest accumulator value is greater or equal to −32368 (requirement b)*65535. In other words, a 32-bit signed accumulator value with a two-complement representation (range: [−2^31, 2^31−1]) can hold both the biggest and smallest possible in-between results. The final De-convolution result is calculated by clipping the accumulator value to a positive range [0, 2^31−1] and divide it by 32768 (2^15).

In another embodiment, the following pseudo can be used to illustrate the hardware de-convolution by the de-convolution circuit block.

```
// SW needs to ensure that the two coefficient requirements are met with respect to
// the sum of the positive and negative coefficient values (HW will NOT
// check for this requirement to be met).
for (r=0; r<R; r++) { // for every RX line
    for (t=0; t<T; T++) { // for every TX pattern
        accum=0; // initialize accumulator
        t_idx=t−(t % n); // align to a multiple of n
        coeff_idx=t % n; // offset of t with respect to multiple of n
        for (i=0; i<n; i++) {// for every drive pattern
```

```
    accum+=coeffs[coeff_idx]*conv_cap[t_idx, r];
    t_idx++;
    coeff_idx++; coeff_idx %=n;
    }
    temp=CLIP (accum, 0, 2^31-1)// get rid of underflow
    temp=temp/32768; // normalization to a 16 bit number
    cap[t, r]=temp; // store capacitance data element
    }
}
```

It should be noted that an underflow during the clipping stage (accumulator value smaller than 0) should typically not occur. This may be an indication that there is something wrong with the panel scan results, such as the results affected by large noise. It should also be noted that an overflow during the clipping stage (accumulator value larger than 2^31−1) cannot occur because the coefficient requirements guarantee that the 32-bit accumulator does not underflow or overflow during the calculations of in-between results. This guarantee is based on a worst case assumption that the convolved data elements have a maximum value of 65535. It should be noted that the maximum value of the convolved data elements is a function of the amount of samples in the TX pattern and the 8-bit individual sample size. For example, if a TX pattern includes 64 samples, the maximum value cannot exceed 64*255 (in which 255 is maximum sample value). If it is known that convolved data elements have a smaller maximum value, the coefficients can be up scaled. This may improve the precision of the final result.

In a further embodiment, when the de-convolution circuit block has completed, an interrupt (e.g., a channel engine interrupt) is generated indicating to the CPU (or other processor core) that a new de-convolved capacitance map is available for further processing.

In another embodiment, the de-convolution control register fields for the amount of TX patterns and RX lines may be different from those used by the sequencer and the channel engine's datapath. This may allow for simultaneous de-convolution and scanning with a different set of control parameters.

Figure 8:
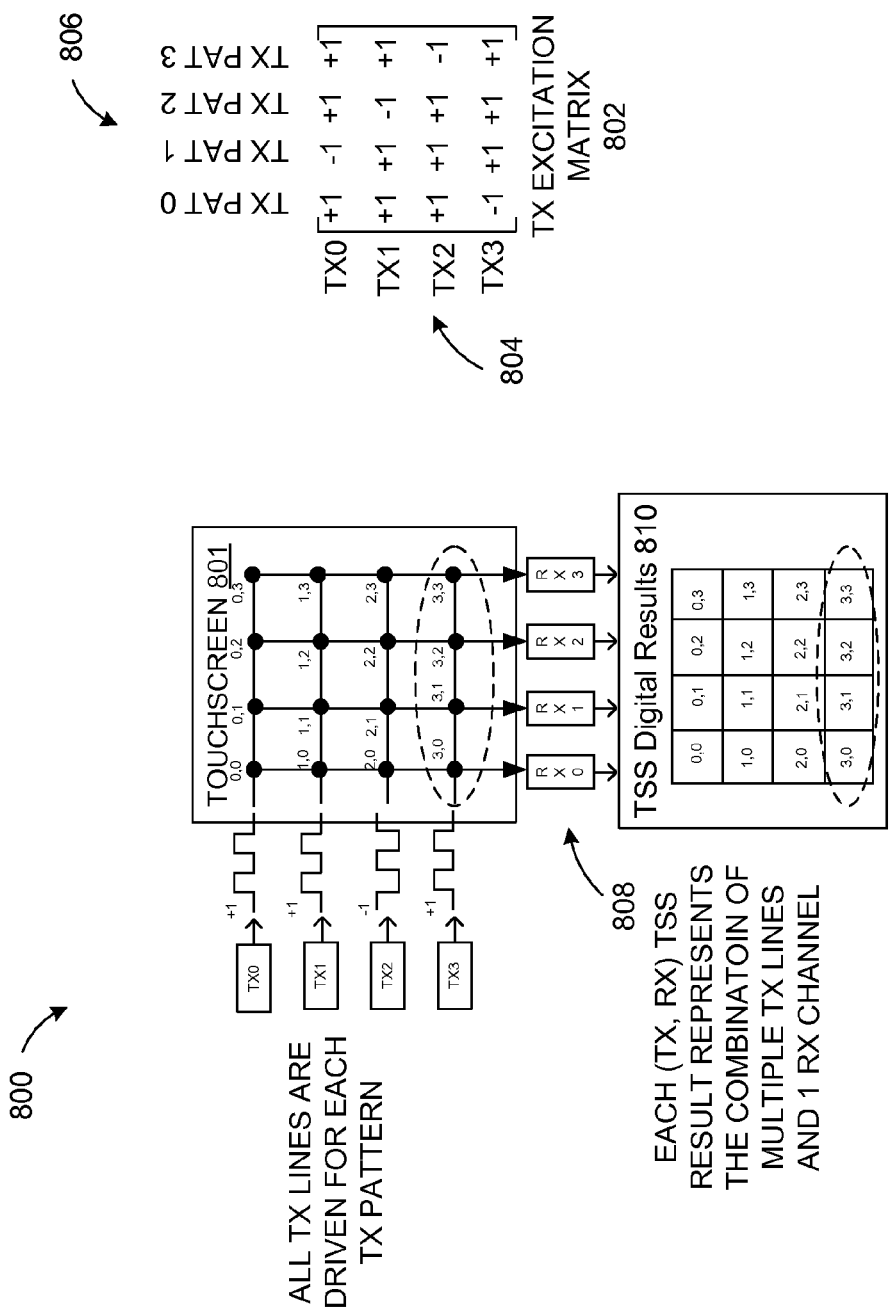
FIG. 8 illustrates multi-phase TX scanning according to a TX excitation matrix according to one embodiment.

FIG. 8 illustrates multi-phase TX scanning 800 according to a TX excitation matrix 802 according to one embodiment. In the multi-phase TX scanning 800, all TX lines 804 of a touchscreen 801 are driven for each TX pattern 806 of the TX excitation matrix 802 and sensed on the RX lines 808. Each intersection (TX,RX) TSS result 810 represents the combination of multiple TX lines 804 and one RX channel 808. The TX excitation matrix 802 includes four TX patterns, where +1 represents a TX pulse and a −1 represents an inverse TX pulse. As described herein, the TSS digital results 810 are initially convolved. The de-convolution circuit block is configured to de-convolve the TSS digital results 810 according to an inverse of the TX excitation matrix 802.

In this embodiment, the TX excitation matrix 802 is four by four. In another embodiment, the TX excitation matrix 802 is eight by eight. In other embodiments, the number of TX lines 804 is a multiple of four and eight. In other embodiments, the number of TX lines 804 may not be a multiple of four and eight, as described with respect to FIG. 9. In these embodiments, the de-convolution circuit block is configured to perform extra de-convolution results when the number of TX lines is not a multiple of four and eight. For example, one touchscreen includes 37 physical TX lines on a panel. In order to perform the de-convolution with multi-phase TX of four or eight, a TX pattern for 40 TX lines can be used for the capacitance map memory, as 40 is greater than the 37 physical TX lines and divisible by both four and eight which are used for the multi-phase orders.

Figure 9:
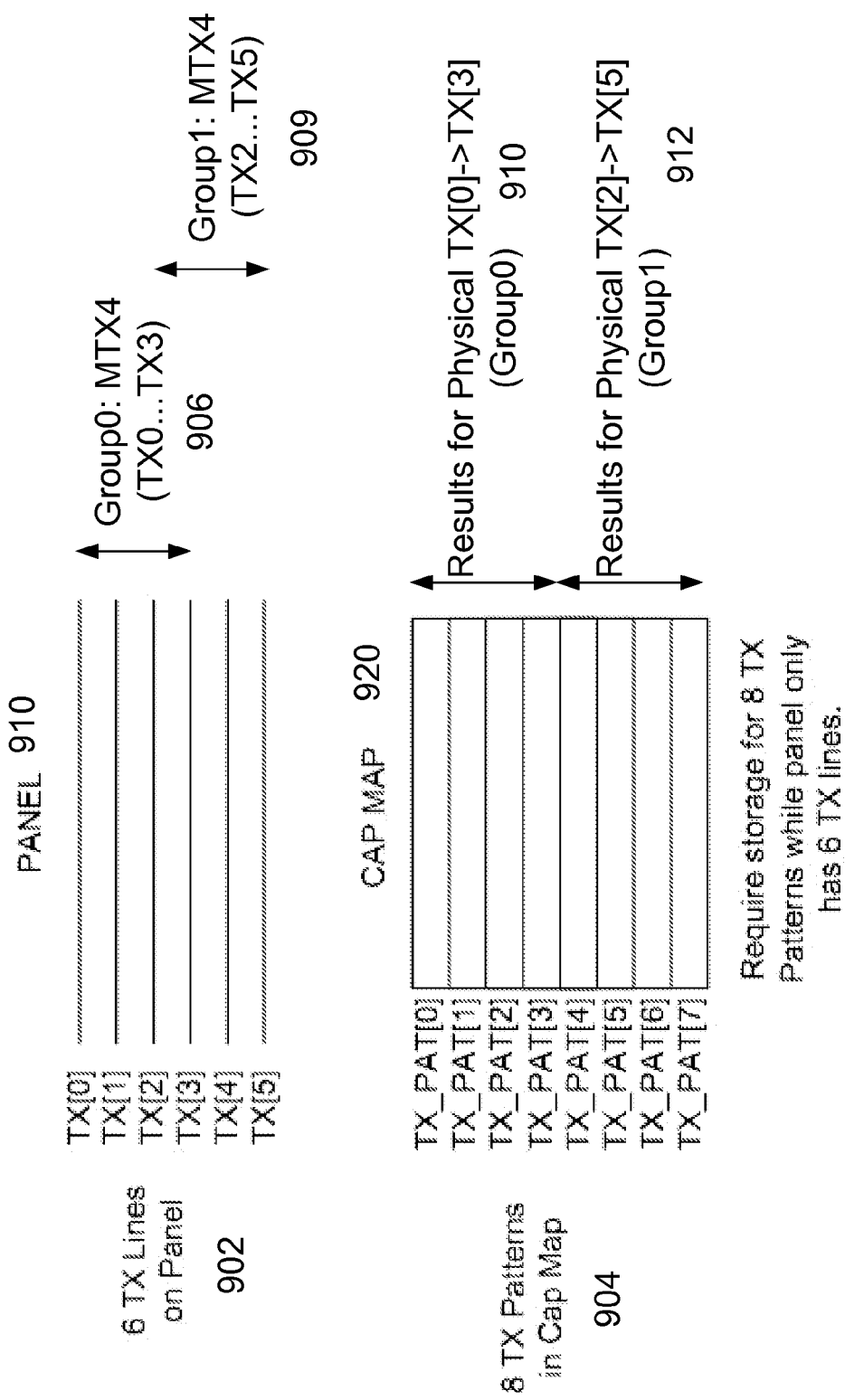
FIG. 9 illustrating mapping non-existent TX lines to a capacitance map for multi-phase TX scanning according to one embodiment.

FIG. 9 illustrating mapping non-existent TX lines to a capacitance map for multi-phase TX scanning according to one embodiment. In this embodiment, there are six TX lines 902 on a panel 910 and eight TX patterns 904 are used in a capacitance map 920 to perform de-convolution calculations. In this embodiment, the first four TX lines 902 are grouped in a first group 906 and the last four TX lines 902 are grouped in a second group 906. It should be noted that the third and fourth TX lines 902 are in both groups. The capacitance map 920 includes the results 910 for the first four physical lines 902 and the results 912 for the last four physical lines 902. This example shows how these extra TX results are generated with an example of six physical TX lines but computes and stores eight TX results in the capacitance map 920 stored in memory.

In another embodiment, the hardware de-convolution circuit block performs de-convolution on the convolved capacitance map as a result of multi-phase TX scanning for each RX/TX intersection of the panel if programmed to do so via MMIO registers. The de-convolved result of each RX/TX intersection is written back to the corresponding location in the capacitance map, overwriting its previous convolved counterpart. Once de-convolution is done on the intersections, an interrupt is issued for the CPU to read back results via a communication bus, such as the ARM® AHB interface, for further higher level processing in the CPU. During hardware de-convolution process, the hardware de-convolution circuit block reads the convolved data from the capacitance map in memory and multiplies the convolved data by the MMIO programmable coefficient values, which represent the inverse matrix of the multi-phase TX scanning used. In a further embodiment, firmware can be used to ensure the MMIO programmable coefficient values are programmed correctly for de-convolution to be successful. The de-convolution circuit block processes all TX's lines for a given RX channel and continues this process from the first RX channel to the final RX channel. It then continues this process starting from the first RX channel until the final RX channel. A single RX channel can process TX's in groups of multi-phase order, an MMIO programmable configuration, from an order of two up to maximum allowable multi-phase TX's of the panel.

Figure 10:
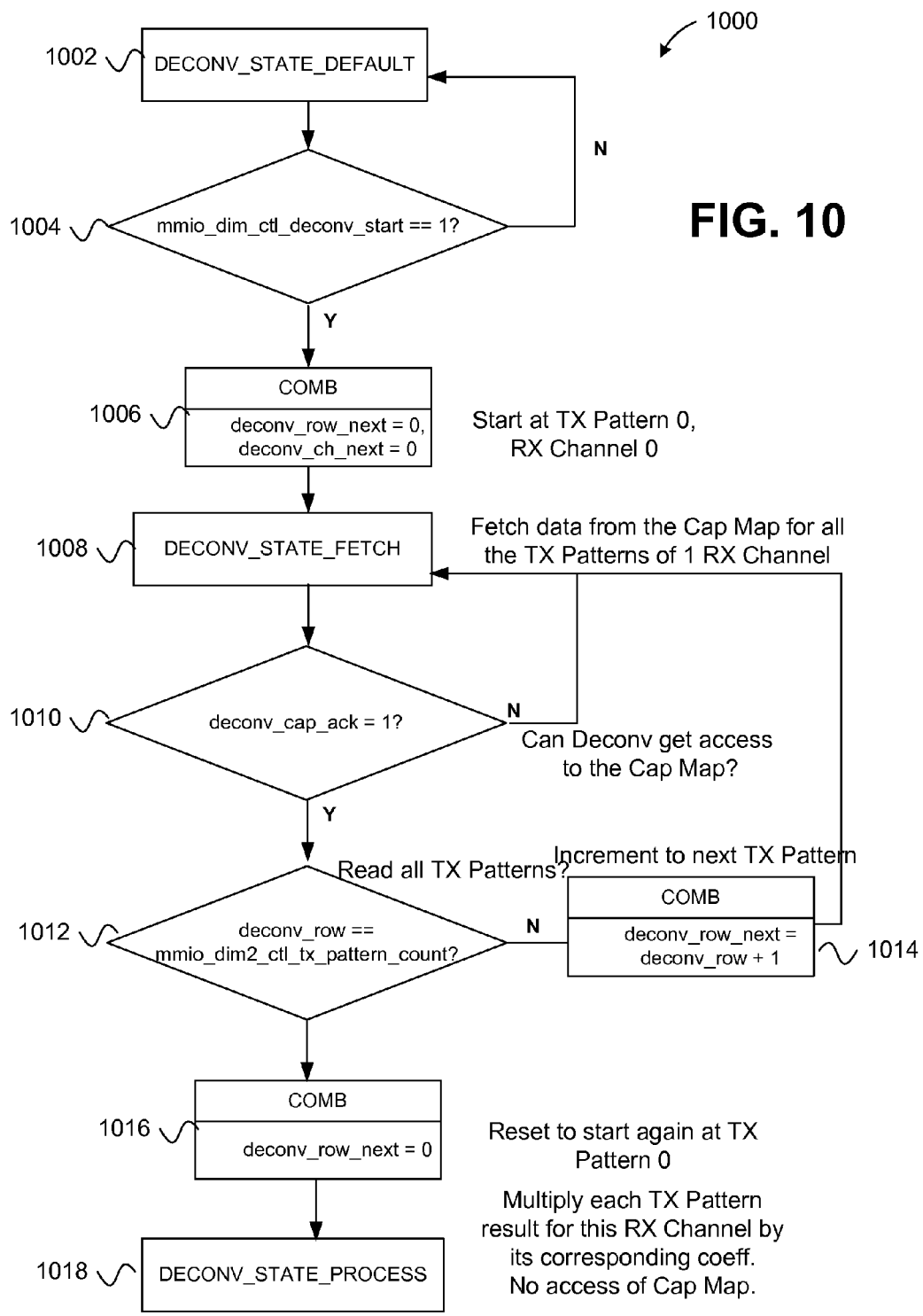
FIG. 10 is a flow diagram of a de-convolution state machine and programmable variables used in a de-convolution circuit block according to one embodiment.

In a further embodiment, a time in TSS clocks to complete the de-convolution in hardware is given by the following equation in which all MMIO values are their absolute form and are not their programmed −1 values:

Time=(mmio_dim2_ctl_tx_pattern_count+
  (((mmio_dim2_ctl_tx_multi_count+2)*
  mmio_dim2_ctl_tx_multi_count)*
  (mmio_dim2_ctl_tx_pattern_count/
  mmio_dim2_ctl_tx_multi_count)))*
  mmio_dim2_ctl_ch_count FIG. 10 is a flow diagram of a de-convolution state machine 1000 and programmable variables used in a de-convolution circuit block according to one embodiment. This flow diagram represents the de-convolution state machine and programmable variables used in one hardware implementation. In one embodiment, the state machine 1000 is implemented in a state machine of the sequencer described herein. In another embodiment, the state machine is implemented in other processing logic implemented in hardware.

The de-convolution state machine 1000 begins a de-convolution default state (block 1002) and determines if a control register indicates to start the de-convolution process (block 1004). If not, the state machine returns to block 1002. If at block 1004 the de-convolution process is started, the state machine sets a first TX pattern on a first RX channel (block 1006) and fetches data from a capacitance map stored in memory for all the TX patterns of 1 RX channel (block 1008). The state machine determines if it has access to the capacitance map (block 1010), and if not, returns to block 1008. If the state machine has access at block 1010, the state machine determines if all TX patterns are read (block 1012). If not, the state machine increments to a next TX pattern for the de-convolution process (block 1014) and returns to block 1008. If all the TX patterns have been read at block 1012, the state machine resets to start again at the first TX pattern (block 1016) and performs the de-convolution of the read data, including multiplying each TX pattern result for this RX channel by its corresponding coefficient (block 1018).

Figure 11:
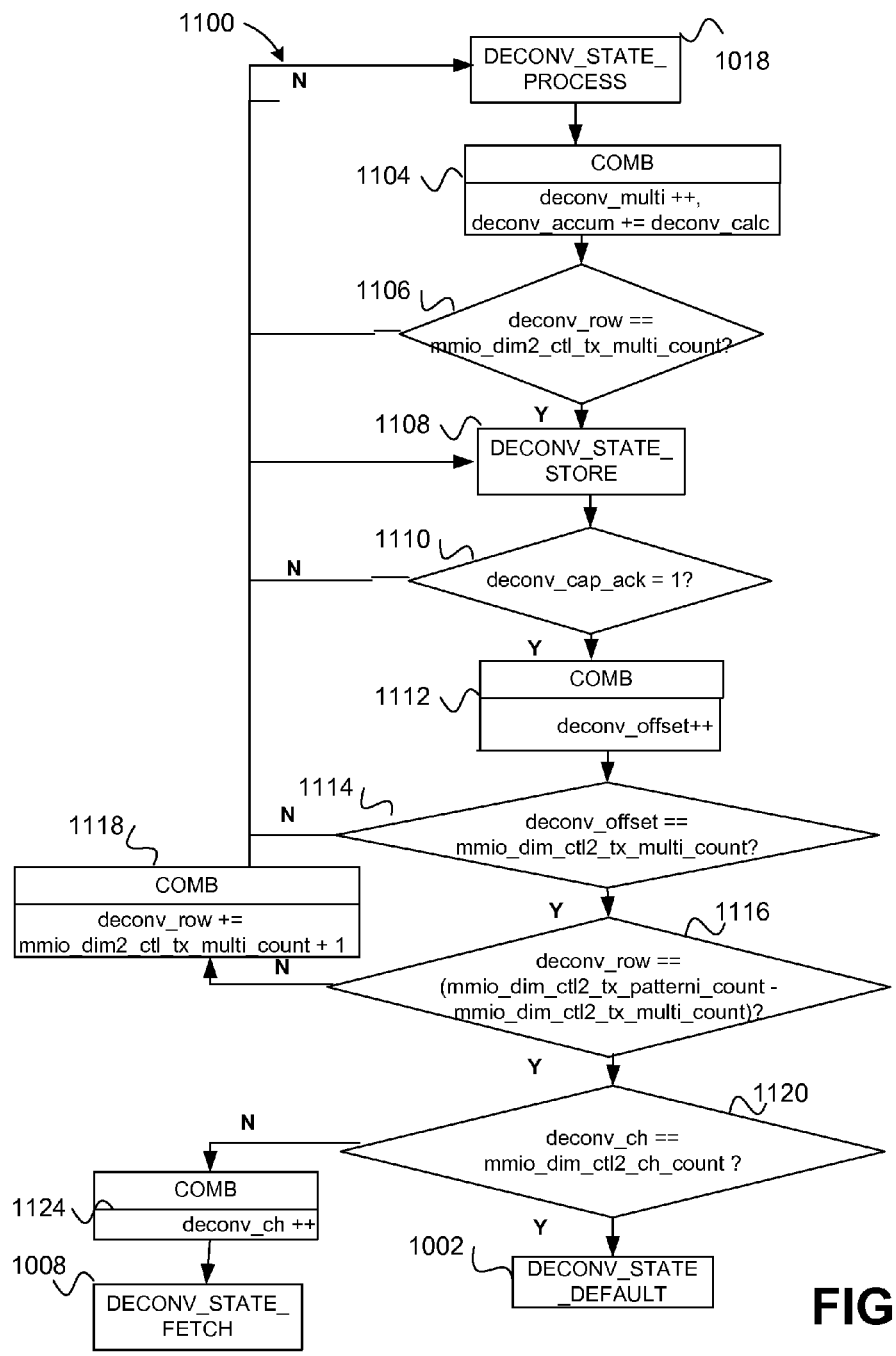
FIG. 11 is a flow diagram of de-convolution operations performed by the de-convolution circuit block according to one embodiment.

FIG. 11 is a flow diagram of de-convolution operations 1100 performed by the de-convolution circuit block according to one embodiment. The de-convolution operations 1100 are operations performed at block 1018 of FIG. 10. As described above, at block 1018, each TX pattern result is multiplied for the RX channel by its corresponding coefficient. At block 1104, the de-convolution circuit block increments de-convolution identifier (deconv_multi) to indicate where the TX pattern is with respect to MPTX_NR, and adds the result of each RX channel and TX pattern (RX,TX Pattern) multiplied by the coefficient to the accumulated result (block 1104). At block 1106, the de-convolution circuit block determines if MPTX_NR locations have been processed by their coefficient for this (RX, TX pattern). If not, the de-convolution circuit block returns to block 1018. If at block 1106, the MPTX_NR locations have been processed, the de-convolution circuit block stores the MPTX_NR of results in the capacitance map (block 1108). At block 1110, the de-convolution circuit block determines if it has access to the capacitance map (block 1110). If so, the de-convolution circuit block increments which TX pattern being written out of the MPTX_NR group (block 1112). If no access at block 1110, the de-convolution circuit block returns to block 1108. At block 1114, the de-convolution circuit block determines if all TX patterns for this MPTX_NR group is written. If not, the de-convolution circuit block returns back to block 1018. At block 1116, the de-convolution circuit block determines if all TX patterns for this RX channel are written. If not, the de-convolution circuit block proceeds to process the next MPTX_NR group (block 1118). If at block 1116 the TX patterns for this RX channel are written, the de-convolution circuit block determines if all RX channels are written (block 1120). If not, the de-convolution circuit block increments the RX channel counter (block 1124) and proceeds to the fetch state 1008 of FIG. 10 to start fetching all TX patterns for the next RX channel. If all RX channels are written, the de-convolution circuit block returns to the default state 1002 of FIG. 10 and clears all counters.

Figure 12:
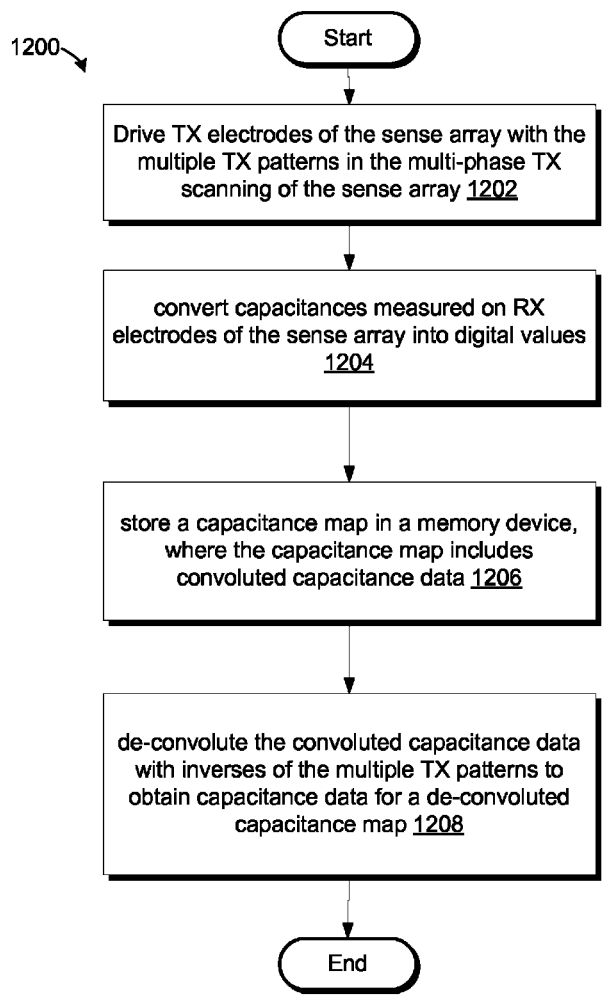
FIG. 12 is a flow diagram of a method of de-convoluting a convolved capacitance map according to one embodiment.

FIG. 12 is a flow diagram of a method 1200 of de-convoluting a convolved capacitance map according to one embodiment. The method 1200 may be performed by processing logic that may comprise hardware (circuitry, dedicated logic, etc.), software (such as is run on a general purpose computing system or a dedicated machine), firmware (embedded software), or any combination thereof. In one embodiment, the processing device 110 performs the method 1200. In another embodiment, the de-convolution circuit block 120 performs the method 1200. Alternatively, other components of the electronic system 100 perform some or all of the operations of method 1200.

Referring to FIG. 12, the method 1200 begins with processing logic driving TX electrodes of the sense array with multiple TX patterns of a multi-phase TX scanning of the sense array (block 1202). The processing logic converts capacitances measured on RX electrodes of the sense array into digital values (block 1204). The processing logic stores a capacitance map in a memory device, where the capacitance map includes convolved capacitance data (block 1206). The processing logic de-convolves the convolved capacitance data with inverses of the multiple TX patterns to obtain capacitance data for a de-convolved capacitance map (block 1208), and the method 1200 ends.

In a further embodiment, the processing logic stores the TX patterns in register fields. Each of the TX patterns includes an element corresponding to a given TX electrodes of the sense array. The element is a first value, a second value, or a third value. The first value indicates a TX pulse signal for the given TX electrode, the second value indicates an inverse TX pulse for the given TX electrode and the third value indicates no TX signal for the given TX electrode. For example, the first value is +1, the second value is −1, and the third value is zero. Alternatively, other values may be used.

In a further embodiment, the TX electrodes are driven with four TX patterns as follows:

TX pattern 0: +1, +1, +1, −1;
TX Pattern 1: −1, +1, +1, +1;
TX Pattern 2: +1, −1, +1, +1; and
TX Pattern 3: +1, +1, −1, +1.

In a further embodiment, the four TX patterns form a first multi-phase group and a second multi-phase group includes zeros.

The processing logic may perform other operations as described above with respect to FIGS. 1-11.

The de-convolution circuit block 120 may be implemented in a capacitive touch screen controller. In one embodiment, the capacitive touch screen controller is the TrueTouch® capacitive touchscreen controllers, such as the CY8CTMA3xx family of TrueTouch® Multi-Touch All-Points touchscreen controllers, developed by Cypress Semiconductor Corporation of San Jose, Calif. The TrueTouch® capacitive touchscreen controllers sensing technology to resolve touch locations of multiple fingers and a stylus on the touch-screens, supports leading operating systems, and is optimized for low-power multi-touch gesture and all-point touchscreen functionality. Alternatively, the touch position calculation features may be implemented in other touchscreen controllers, or other touch controllers of touch-sensing devices. In one embodiment, the touch position calculation features may be implemented with other touch filtering algorithms as would be appreciated by one of ordinary skill in the art having the benefit of this disclosure.

The embodiments described herein may be used in various designs of mutual-capacitance sensing arrays of the capacitance sensing system, or in self-capacitance sensing arrays. In one embodiment, the capacitance sensing system detects multiple sense elements that are activated in the array, and can analyze a signal pattern on the neighboring sense elements to separate noise from actual signal. The embodiments described herein are not tied to a particular capacitive sensing solution and can be used as well with other sensing solutions, including optical sensing solutions, as would be appreciated by one of ordinary skill in the art having the benefit of this disclosure.

In the above description, numerous details are set forth. It will be apparent, however, to one of ordinary skill in the art having the benefit of this disclosure, that embodiments of the present invention may be practiced without these specific details. In some instances, well-known structures and devices are shown in block diagram form, rather than in detail, in order to avoid obscuring the description.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "encrypting," "decrypting," "storing," "providing," "deriving," "obtaining," "receiving," "authenticating," "deleting," "executing," "requesting," "communicating," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such.

Embodiments descried herein may also relate to an apparatus for performing the operations herein. This apparatus may be specially constructed for the required purposes, or it may comprise a general-purpose computer selectively activated or reconfigured by a computer program stored in the computer. Such a computer program may be stored in a non-transitory computer-readable storage medium, such as, but not limited to, any type of disk including floppy disks, optical disks, CD-ROMs and magnetic-optical disks, read-only memories (ROMs), random access memories (RAMs), EPROMs, EEPROMs, magnetic or optical cards, flash memory, or any type of media suitable for storing electronic instructions. The term "computer-readable storage medium" should be taken to include a single medium or multiple media (e.g., a centralized or distributed database and/or associated caches and servers) that store one or more sets of instructions. The term "computer-readable medium" shall also be taken to include any medium that is capable of storing, encoding or carrying a set of instructions for execution by the machine and that causes the machine to perform any one or more of the methodologies of the present embodiments. The term "computer-readable storage medium" shall accordingly be taken to include, but not be limited to, solid-state memories, optical media, magnetic media, any medium that is capable of storing a set of instructions for execution by the machine and that causes the machine to perform any one or more of the methodologies of the present embodiments.

The algorithms and displays presented herein are not inherently related to any particular computer or other apparatus. Various general-purpose systems may be used with programs in accordance with the teachings herein, or it may prove convenient to construct a more specialized apparatus to perform the required method steps. The required structure for a variety of these systems will appear from the description below. In addition, the present embodiments are not described with reference to any particular programming language. It will be appreciated that a variety of programming languages may be used to implement the teachings of the embodiments as described herein.

The above description sets forth numerous specific details such as examples of specific systems, components, methods and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth above are merely exemplary. Particular implementations may vary from these exemplary details and still be contemplated to be within the scope of the present invention.

It is to be understood that the above description is intended to be illustrative and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A processing device comprising:
   a memory device configured to store a capacitance map comprising convolved capacitance data, wherein the convolved data is a result of multi-phase transmit (TX) scanning of a sense array with a plurality of TX patterns, the scanning of the sense array with each of the plurality of TX patterns including simultaneously driving different phases of a signal on the sense array; and
   a de-convolution circuit block coupled to the memory device, wherein the de-convolution circuit block is configured to de-convolve the convolved capacitance data with inverses of the plurality of TX patterns to obtain capacitance data for a de-convolved capacitance map.

2. The processing device of claim 1, wherein the de-convolution circuit block comprises registers to store a plurality of programmable coefficients, wherein the plurality of programmable coefficients implement a de-convolution algorithm to de-convolve the convolved capacitance data.

3. The processing device of claim 2, wherein the registers are further configured to store the plurality of TX patterns, wherein each of the plurality of TX patterns comprises an element for a plurality of TX drive lines, wherein the element is at least one of a first value, a second value or a third value, wherein the first value indicates a TX pulse signal for a given TX drive line, the second value indicates an inverse TX pulse signal for the given TX drive line and the third value indicates no TX pulse signal for the given TX drive line.

4. The processing device of claim 3, wherein the plurality of TX patterns comprise four TX patterns as follows:
TX pattern 0: +1, +1, +1, −1;
TX Pattern 1: −1, +1, +1, +1;
TX Pattern 2: +1, −1, +1, +1; and
TX Pattern 3: +1, +1, −1, +1.

5. The processing device of claim 4, wherein the four TX patterns form a first multiphase group, and wherein a second multi-phase group comprises zeros.

6. The processing device of claim 3, wherein the plurality of TX patterns comprise a first set of TX patterns comprising the following TX patterns:
TX pattern 0: +1, +1, +1, −1, 0, 0, 0, 0;
TX Pattern 1: −1, +1, +1, +1, 0, 0, 0, 0;
TX Pattern 2: +1, −1, +1, +1, 0, 0, 0, 0; and
TX Pattern 3: +1, +1, −1, +1, 0, 0, 0, 0, and wherein the plurality of TX patterns comprises a second set of TX patterns comprising the following TX patterns:
TX pattern 0: 0, 0, 0, 0, +1, +1, +1, −1;
TX Pattern 1: 0, 0, 0, 0, −1, +1, +1, +1;
TX Pattern 2: 0, 0, 0, 0, +1, −1, +1, +1; and
TX Pattern 3: 0, 0, 0, 0, +1, +1, −1, +1.

7. The processing device of claim 1, wherein the de-convolution circuit block is configured to perform in-place de-convolution in which the convolved capacitance data is overwritten in the memory device with the capacitance data after the de-convolution.

8. The processing device of claim 1, wherein the capacitance map comprises a number, T, TX patterns and a number, R, of RX lines as specified in memory-mapped input-output (MMIO) register fields, wherein the multi-phase TX scanning comprises a multi-phase identifier, n, with T being an integer of n, wherein n is specified in another MMIO register field, and wherein additional MMIO register fields store a plurality of programmable coefficients.

9. The processing device of claim 8, wherein the de-convolution circuit block comprises an accumulator to hold an in-between result of a de-convolution calculation, wherein the de-convolution calculation multiplies a value of the convolved capacitance data in the capacitance map with a corresponding one of the plurality of programmable coefficients to obtain a result, wherein a sum of the results of the de-convolution calculations is an accumulator value, and wherein a final de-convolution result is calculated by clipping the accumulator value to a positive range and scaling the accumulator value.

10. The processing device of claim 9, wherein the accumulator comprises x bits with a range of [−2^x, 2^x−1], and wherein the final de-convolution result is calculated by clipping the accumulator value to the positive range [0, 2^x−1] and dividing by a normalize value, 2^(x/2), to scale the accumulator value.

11. The processing device of 1, wherein the de-convolution circuit block is configured to issue an interrupt to a central processing unit (CPU) of the processing device to indicate a de-convolved capacitance map is available for further processing by the CPU.

12. The processing device of claim 1, wherein the de-convolution circuit block is configured to perform extra de-convolution results when a number of TX lines is not a multiple of four and eight.

13. A method comprising:
storing a capacitance map in a memory device of a processing device, wherein the capacitance map comprises convolved capacitance data, wherein the convolved data is a result of a multi-phase transmit (TX) scanning of a sense array with a plurality of TX patterns, the scanning of the sense array with each of the plurality of TX patterns including simultaneously driving different phases of a signal on the sense array; and
de-convoluting, by a de-convolution circuit block of the processing device, the convolved capacitance data with inverses of the plurality of TX patterns to obtain capacitance data for a de-convolved capacitance map.

14. The method of claim 13, further comprising:
driving, by a capacitance-sensing circuit, TX electrodes of the sense array with the plurality of TX patterns in the multi-phase TX scanning of the sense array; and
converting, by the capacitance-sensing circuit, capacitances measured on RX electrodes of the sense array into digital values, wherein each of the digital values represent an intersection of one of the TX electrodes and one of the RX electrodes.

15. The method of claim 14, further comprising storing the plurality of TX patterns in register fields, wherein each of the plurality of TX patterns comprises an element corresponding to a given TX electrodes, wherein the element is at least one of a first value, a second value or a third value, wherein the first value indicates a TX pulse signal for the given TX electrode, the second value indicates an inverse TX pulse signal for the given TX electrode and the third value indicates no TX pulse signal for the given TX electrode.

16. The method of claim 13, wherein the driving the TX electrodes comprises driving the TX electrodes with the following four TX patterns:
TX pattern 0: +1, +1, +1, −1;
TX Pattern 1: −1, +1, +1, +1;
TX Pattern 2: +1, −1, +1, +1; and
TX Pattern 3: +1, +1, −1, +1.

17. The method of claim 16, wherein the four TX patterns form a first multi-phase group, and wherein a second multi-phase group comprises zeros.

18. A touchscreen controller (TSC) device comprising:
a capacitance-sensing circuit configured to obtain a capacitance map comprising a capacitance of an intersection of a transmit (TX) electrode and a receive (RX) electrode of a touchscreen, wherein the capacitance map is convolved as a result of a multi-phase TX scanning of the touchscreen, the multi-phase TX scanning of the touchscreen including driving different phases of a signal on the touchscreen during a period;
a memory device coupled to the capacitance-sensing circuit, wherein the memory device is configured to store the capacitance map; and
a programmable digital circuit block comprising:
a register comprising a plurality of register fields to store a plurality of programmable coefficients for de-convolution calculations; and
a de-convolution engine configured to perform the de-convolution calculations of the capacitance map using the plurality of programmable coefficients to obtain a de-convolved capacitance map and to issue an interrupt to indicate an availability of the de-convolved capacitance map to a processor core when the de-convolution calculations are performed.

19. The TSC device of claim 18, wherein the de-convolution engine comprises an accumulator.

20. The TSC device of claim 18, wherein the plurality of register fields are memory mapped input-output (MMIO) register fields, and wherein the MMIO register fields are further configured to store at least one of:
- an amount of TX patterns used in the multi-phase TX scanning;
- an amount of RX lines of the touchscreen;
- a multi-phase identifier that identifies a current one of the TX patterns used in the multi-phase TX scanning;
- de-convolution coefficients;
- multi-phase TX scanning identifiers; or
- polarity control for each TX electrode of the touchscreen.

* * * * *